(12) United States Patent
Lussier

(10) Patent No.: US 11,592,464 B2
(45) Date of Patent: *Feb. 28, 2023

(54) UNIVERSAL MATE-IN CABLE INTERFACE SYSTEM

(71) Applicant: ZIOTA TECHNOLOGY INC., Magog (CA)

(72) Inventor: Alain Lussier, Ogden (CA)

(73) Assignee: ZIOTA TECHNOLOGY INC.

( * ) Notice: Subject to any disclaimer, the term of this patent is extended or adjusted under 35 U.S.C. 154(b) by 37 days.

This patent is subject to a terminal disclaimer.

(21) Appl. No.: 17/220,426

(22) Filed: Apr. 1, 2021

(65) Prior Publication Data

US 2021/0223286 A1 Jul. 22, 2021

Related U.S. Application Data

(63) Continuation of application No. 16/883,389, filed on May 26, 2020, now Pat. No. 10,989,737, which is a
(Continued)

(51) Int. Cl.
*G01R 1/04* (2006.01)
*H01R 31/06* (2006.01)
(Continued)

(52) U.S. Cl.
CPC .......... *G01R 1/0416* (2013.01); *G01R 31/44* (2013.01); *G01R 31/66* (2020.01); *H01R 31/065* (2013.01);
(Continued)

(58) Field of Classification Search
CPC ...... G01R 1/0416; G01R 31/44; G01R 31/66; G01R 31/086; H01R 31/065; Y10T 29/53209
See application file for complete search history.

(56) References Cited

U.S. PATENT DOCUMENTS 5,072,185 A * 12/1991 Rockwell ............... G01R 31/58
29/593
8,912,800 B2 * 12/2014 Gervais .................. G01R 31/58
324/540
(Continued)

*Primary Examiner* — Akm Zakaria
(74) *Attorney, Agent, or Firm* — Benoit & Cote Inc.; Charles-Andre Caron

(57) ABSTRACT

An assembly for interfacing an existing harness connector of an installed wiring harness to a test module. The assembly comprises: a harness-specific connector which is connectable to the existing harness connector, a test box connector module connected to the harness-specific connector, for connecting to a test module, and a unique identifier which is readable on the assembly and which is unique to the test box connector module; wherein the unique identifier is used to identify the test box connector module and to determine, from a list of unique mate-in interface IDs and associated connector configurations, which one of the associated connector configurations corresponds to the identifier of the assembly, and within the one of the associated connector configurations corresponding to the unique mate-in interface ID of the mate-in interface, to determine the correspondence between contacts of the test module to contacts of the existing harness connector.

19 Claims, 16 Drawing Sheets

Related U.S. Application Data continuation of application No. 16/146,609, filed on Sep. 28, 2018, now Pat. No. 10,697,999, which is a continuation of application No. 15/424,006, filed on Feb. 3, 2017, now Pat. No. 10,088,501, which is a continuation-in-part of application No. 14/014,320, filed on Aug. 29, 2013, now Pat. No. 9,810,732, which is a continuation-in-part of application No. 12/953,558, filed on Nov. 24, 2010, now Pat. No. 8,547,108.

(51) Int. Cl.
*G01R 31/44* (2020.01)
*G01R 31/66* (2020.01)
*G01R 31/08* (2020.01)

(52) U.S. Cl.
CPC ....... *G01R 31/086* (2013.01); *Y10T 29/53209* (2015.01)

(56) References Cited

U.S. PATENT DOCUMENTS

| | | | |
|---|---|---|---|
| 10,989,737 B2* | 4/2021 | Lussier | G01R 31/44 |
| 2003/0006779 A1* | 1/2003 | H. Youval | G01R 31/50 |
| | | | 324/503 |
| 2006/0132119 A1* | 6/2006 | Collins | G01R 31/2889 |
| | | | 324/756.05 |
| 2014/0075051 A1* | 3/2014 | Zadesky | G06F 13/122 |
| | | | 710/3 |

* cited by examiner

UNIVERSAL MATE-IN CABLE INTERFACE SYSTEM

CROSS-REFERENCE TO RELATED APPLICATIONS

This application is a continuation of U.S. Ser. No. 16/883,389, filed May 26, 2020, which is a continuation of U.S. Ser. No. 16/146,609, filed Sep. 28, 2018, which is a continuation of U.S. Ser. No. 15/424,006, filed Feb. 3, 2017, which is a continuation-in-part of U.S. Ser. No. 14/014,320 filed Aug. 29, 2013, which is a continuation application of U.S. patent application Ser. No. 12/953,558 filed Nov. 24, 2010, the specifications of which are hereby incorporated herein by reference in their entirety.

BACKGROUND

(a) Field

The subject matter disclosed generally relates to testing tools. More specifically, this description relates to interfaces between testers and devices having connectors.

(b) Related Prior Art

An electrical wiring harness typically comprises a bundle of individual connector wires of varying gauges, impedances and types, all arranged and distributed at different locations within an installation, such as a transport vehicle. Such wiring harnesses are used to interconnect the various components and subassemblies located within the vehicles.

The number of possible electrical interconnections within a vehicle grows exponentially with the number of wires and various components and subassemblies located within the vehicles.

Electrical problems within a harness or an electrical sub-system of an installation (ex: transport vehicle) are incredibly hard to identify and locate, especially for already installed harnesses. Faults can occur from bad interconnections, faulty electrical component (such as computer hardware, resistance, coil, sensor) or a software programming bug. The electrical subsystem is a combination of those elements interconnected together, and any element must perform optimally for proper performance.

In the prior art, a typical method of testing an installed harness is by using a manual test equipment to ring one, many or all nodes of the harness under test, ringing being a term known in the art for doing a continuity test. Unfortunately, such a method is inconvenient as it presents numerous drawbacks. Such a method requires that a plurality of operators be deployed at various connection points along the wiring harness, their locations being chosen in accordance with electrical schematics, and the operators communicating and coordinating testing procedures through walkie-talkies. With prior art methods, the operators have to ring cables, one at a time, which requires many operators for complex or multiple connections. It is likely that only specific connections will be tested based on the electrical schematic of the harness under test, leaving a large number of possible connections not being tested.

Another prior art method of testing a wiring harness involves connecting automated test equipment or components to the installed harness via interface cables and performing the testing. The difficulty that arises with this prior art technique is that of having at the time of the test an interface connection that on one side is connected to the test equipment, and on the other side has a mating connector that will permit to attach directly to the connector of the cable or equipment under test. This mating connector must have characteristics that will match to that of the connector of the cable or equipment under test: connector shell size, model, keyways, opposite sex male or female connectors, contacts size, model, opposite sex male or female, and others characteristics known to a person of the art. Currently, such interface connection must be prepared in advance of the test. The reality is that the user of the test equipment has to order the specific mating connectors, sometimes waiting days and weeks before a supplier can deliver them, and then incorporating them into an interface connection that will connect to the test equipment, first by manually connecting node by node all or part of the mating connector testing points, and secondly by programming the test equipment or mating interface with the characteristics of the mating connector.

It is known to the prior art that if the cable mate-in interface connection is not readily available at the time of the test, a user may prepare a temporary cable interface using clamps, terminal boards, connector contacts and other tools or devices connected to the test system generic interface connection. The difficulty from using such temporary cable interface is that it is a practice which is prone to errors and omissions and which does not allow for reliable analysis of the data recorded by the test equipment and it does not permit to record it precisely with the specification of the electrical schematics of the harness under test over time.

It is also known in the prior art that the cable mate-in interface must be programmed into a test program to allocate the sequence of the routing of the contact of the specific connector in relation to the connector of the test equipment. This practice requires time and testing to allow for reliable test procedures.

Thus, existing test equipment cannot be used to their full capacity when cable mating interface are not readily available at the time of the test, which would allow for performing testing on multiple wires at a time and allow for gathering complete and accurate information regarding the wires.

Electrical problems within various components and sub-assemblies are generally found using a multi-meter or other test equipment designed specifically for the component or subassembly to test; in any case, mating interfaces may also be required to carry out a full analysis of the nodes of the component or subassembly under test.

There exists therefore a need for a reliable assembly for interfacing an existing harness/equipment connector to a test module which can be automated and simplified to reduce time, cost efficient, reliable, not prone to human error and that provides adequate documentation for traceability.

SUMMARY

The subject matter disclosed generally relates to tools for testing wires, wiring harnesses, equipment or any combination of them that have specific electrical connectors to interconnect with them. More specifically, this description relates to interfaces between testers and the specific electrical connectors to which wires, wiring harness, equipment or any combination of them to be tested are hooked up, whether the testers are used for audit of their configuration when they are build or modified, or for their periodic maintenance or specific troubleshooting. For matter of simplicity, reference will only be made to harness/equipment connector whether the subject of the test is wire, wiring harness, equipment, or any combination thereof them in relation to an electrical sub-system.

According to an embodiment, there is provided an assembly for interfacing an existing harness connector of an installed wiring harness to a test module, the assembly comprising: a harness-specific connector which is connectable to the existing harness connector, a test box connector module connected to the harness-specific connector, for connecting to a test module, and a unique identifier which is readable on the assembly and which is unique to the test box connector module; wherein the unique identifier is used to identify the test box connector module and to determine, from a list of unique mate-in interface IDs and associated connector configurations, which one of the associated connector configurations corresponds to the identifier of the assembly, and within the one of the associated connector configurations corresponding to the unique mate-in interface ID of the mate-in interface, to determine the correspondence between contacts of the test module to contacts of the existing harness connector.

According to an aspect, the assembly comprises a memory comprising the identifier which is readable in the memory.

According to an aspect, the assembly comprises a label comprising the identifier which is readable on the label.

According to an aspect, the assembly comprises the identifier etched onto the mate-in interface to be readable thereon.

According to an aspect, the harness-specific connector is a separate and distinct entity from the test box connector module.

According to an aspect, the assembly further comprises a computing device for performing the step of using the identifier which is readable to identify the test box connector module and to determine, from a list of unique mate-in interface IDs and associated connector configurations, which one of the associated connector configurations corresponds to the identifier of the assembly.

According to an aspect, the computing device is further for performing the step of determining the correspondence between the contacts of the test module to the contacts of the existing harness connector and to instruct a continuity test signal through the contacts of the existing harness connector.

According to an embodiment, there is provided a method for interfacing an existing harness connector of an installed wiring harness to a test module with an assembly, the method comprising: providing a harness-specific connector which is connectable to the existing harness connector, providing a test box connector module connected to the harness-specific connector, for connecting to a test module, providing a unique identifier which is readable on the assembly and which is unique to the test box connector module; using the unique identifier to identify the test box connector module; using the unique identifier to determine, from a list of unique mate-in interface IDs and associated connector configurations, which one of the associated connector configurations corresponds to the identifier of the assembly, and within the one of the associated connector configurations corresponding to the unique mate-in interface ID of the mate-in interface, determining the correspondence between contacts of the test module to contacts of the existing harness connector.

According to an aspect, the mate-in interface comprises a memory comprising the identifier which is readable in the memory.

According to an aspect, the mate-in interface comprises a label comprising the identifier which is readable on the label.

According to an aspect, the mate-in interface comprises the identifier etched onto the mate-in interface to be readable thereon.

According to an aspect, the harness-specific connector is a separate and distinct entity from the test box connector module.

According to an aspect, the method further comprises a computing device for performing the steps of using the unique identifier to identify the test box connector module and to determine which one of the associated connector configurations corresponds to the identifier of the assembly.

According to an embodiment, there is provided a system for testing equipment using a test box unit for testing the equipment, the system comprising: a mate-in interface for connection to the test box unit; and for connection to contacts on the equipment, the mate-in interface having a unique mate-in interface identifier being readable thereon; and a computing device adapted to: retrieve, from a list identifiers and associated connector configurations, which one of the associated connector configurations corresponds to the identifier of the mate-in interface; within the one of the associated connector configurations corresponding to the unique mate-in interface identifier of the mate-in interface, select any one of the contacts for testing; and trigger a first signal to be inputted through the any one of the contacts to ground and measure the first signal; and trigger a second signal to be inputted through the any one of the contacts to any other one of the contacts and measure the second signal.

According to an aspect, the mate-in interface comprises a memory comprising the identifier which is readable in the memory.

According to an aspect, the mate-in interface comprises a label comprising the identifier which is readable on the label.

According to an aspect, the mate-in interface comprises the identifier etched onto the mate-in interface to be readable thereon.

According to an aspect, the mate-in interface comprises: a generic mate-in interface for connection to the test box unit, the generic mate-in interface having the identifier readable thereon; and a specific mate-in interface for connection to the generic mate-in interface, the specific mate-in interface for connection to the equipment.

According to an aspect, the mate-in interface comprises: a generic mate-in interface for connection to the test box unit; and a specific mate-in interface for connection to the generic mate-in interface, the specific mate-in interface for connection to the equipment, the specific mate-in interface having the identifier readable thereon.

According to an embodiment, there is provided an intermediate mate-in interface for enabling a connection between a generic mate-in interface and a specific mate-in interface, the intermediate mate-in interface comprising:

a generic-to-intermediate connector for connecting the generic mate-in interface to the intermediate mate-in interface;

an intermediate-to-specific connector for connecting the intermediate mate-in interface to the specific mate-in interface; and an input/output connector connected between the generic-to-intermediate connector and the intermediate-to-specific connector, for enabling at least one of inputting a signal into the intermediate mate-in interface and outputting a signal from the intermediate mate-in interface;

wherein the specific mate-in interface is for connecting to harness/equipment connectors, and wherein the generic mate-in interface is for connecting to a test box unit.

According to another embodiment, the input/output connector is adapted for connection to a device adapted for generating a signal.

According to another embodiment, the input/output connector is adapted for connection to a device adapted for measuring at least one attribute of a signal or circuit.

According to another embodiment, the input/output connector comprises a plurality of contacts.

According to another embodiment, the plurality of contacts comprises at least one of pins, sockets, alligator clips, banana plugs, coaxial cables, optical fibers, and a connector adapted to mate with a device adapted for generating a signal or adapted for measuring at least one attribute of a signal or circuit.

According to an embodiment, there is provided a method of testing equipment having a harness/equipment connector for connection to a specific mate-in interface, the method comprising:
connecting a generic mate-in interface to a test box unit;
connecting an intermediate mate-in interface to the generic mate-in interface;
connecting the specific mate-in interface to the intermediate mate-in interface;
connecting the specific mate-in interface to the harness/equipment connector;
connecting to the intermediate mate-in interface at least one of a device adapted for generating a signal and a device adapted for measuring at least one attribute of a signal or circuit; and
performing tests on the equipment having a harness/equipment connector using the at least one of a device adapted for generating a signal and a device adapted for measuring at least one attribute of a signal or circuit.

According to another embodiment, the method further comprises reconfigurably assigning a portion of test contacts of a test box connector which provides the connection from the generic mate-in interface to the test box unit, wherein the assignment of the portion of test contacts is made into a specific mate-in level subset and the generic mate-in interface has a unique test box connector ID, the assigning comprising:
detecting, through the generic mate-in interface, a unique specific mate-in interface ID of the specific mate-in interface; and
determining, from the detected unique specific mate-in interface ID, an assignment of the portion of test contacts.

According to another embodiment, the assigning comprises;
detecting, through the generic mate-in interface, a unique intermediate mate-in interface ID of the intermediate mate-in interface; and
determining, from the detected unique intermediate mate-in interface ID, an assignment of the portion of test contacts.

According to another embodiment, the assignment of the portion of test contacts is made into a specific mate-in level subset and the generic mate-in interface has a unique test box connector ID, the method further comprises:
detecting the unique test box connector ID; and
determining, from the detected unique test box connector ID, an assignment of the test contacts into generic level subsets wherein one of the generic level subsets comprises the specific mate-in level subset.

According to another embodiment, there is provided a universal mate-in interface kit for enabling a connection between a test box unit and harness/equipment connectors, the kit comprising: a selection of at least two specific mate-in interfaces, each one of the at least two specific mate-in interfaces having, at one end, an intermediate connector connected, at an other end, to specific connectors for connecting to harness/equipment connectors, thereby providing a specific level one-to-many mate-in interface; and a generic mate-in interface having, at one end, at least two generic connectors each for connecting to a respective one of the intermediate connectors of the at least two specific mate-in interfaces, the generic mate-in interface having, at an other end, a test box connector for connecting to the test box unit, thereby providing a generic level one-to-many mate-in interface; wherein having two levels of one-to-many mate-in interfaces provides a greater number of specific connectors available for connecting to the harness/equipment connectors than a single level one-to-many mate-in interface.

According to an embodiment, there is described herein the universal mate-in interface kit above, wherein the test box connector comprises contacts and each one of the at least two generic connectors comprise contacts, the kit further comprising connection wires between at least some of the contacts of the test box connector and at least some of the contacts of each one of the at least two generic connectors.

According to an embodiment, there is described herein the universal mate-in interface kit above, wherein one intermediate connector has a contact configuration which is different from a contact configuration of another intermediate connector, and wherein the at least two generic connectors each have a different contact configuration for connecting to a respective one of the intermediate connectors having a matching contact configuration.

According to an embodiment, there is described herein the universal mate-in interface kit above, wherein the test box connector has a unique test box connector ID and contacts, a portion of the contacts being reserved for communicating the unique test box connector ID and an other portion of the contacts being reconfigurably assignable.

According to an embodiment, there is described herein the universal mate-in interface kit above, wherein upon connection of the test box connector to the test box unit, the unique test box connector ID is used in determining an assignment of the other portion of the contacts into subsets.

According to an embodiment, there is described herein the universal mate-in interface kit above, wherein each one of the specific mate-in interfaces has a unique specific mate-in interface ID and upon connection of at least one of the specific mate-in interfaces to the generic mate-in interface, the unique specific mate-in interface ID is used in determining an assignment of the contacts in one of the subsets into further subsets.

According to an embodiment, there is described herein the universal mate-in interface kit above, wherein the intermediate connector comprises a memory device for storing the unique specific mate-in interface ID.

According to an embodiment, there is described herein the universal mate-in interface kit above, wherein the test box connector further comprises a memory device for storing the unique test box connector ID.

According to yet another embodiment, there is provided a software-implemented method of reconfigurably assigning a portion of test contacts of a test box unit which is for testing equipment having a harness/equipment connector for connection to a specific mate-in interface, the method comprising: connecting a generic mate-in interface to the test box unit; connecting the specific mate-in interface to the generic mate-in interface; detecting, through the generic mate-in interface, a unique specific mate-in interface ID of the connected specific mate-in interface; determining, from the detected unique specific mate-in interface ID, an assignment of the portion of test contacts.

According to an embodiment wherein the assignment of the portion of test contacts is made into a specific mate-in level subset and the generic mate-in interface has a unique test box connector ID, the method further comprises: detecting the unique test box connector ID; and determining, from the detected unique test box connector ID, an assignment of the test contacts into generic level subsets wherein one of the generic level subsets comprises the specific mate-in level subset.

According to an embodiment, the method further comprises consulting a database through the test box unit for both the determining of the assignment of the portion of the test contacts into a specific mate-in level subset and the determining of the assignment of the test contacts into generic level subsets.

According to an embodiment, the method further comprises consulting a database through the test box unit for the determining of the assignment of the test contacts.

It should be noted that the inventive concepts described herein apply equally to electrical or optical applications. That is, all connectors can be electrical or optical connectors. Also, all wires can be electrical wires or can also be optical fibers.

According to an aspect of the invention, there is provided a generic mate-in interface for enabling a connection between a test box unit and specific mate-in interfaces, the specific mate-in interfaces for connecting to harness/equipment connectors. The generic mate-in interface comprises: a generic mate-in interface memory provided at a location on the generic mate-in interface and comprising configuration information for the generic mate-in interface; a test box connector for connecting to the test box unit, the test box connector having a unique test box connector ID and contacts, a portion of the contacts being reserved for communicating the unique test box connector ID and an other portion of the contacts being reconfigurably assignable; upon connection of the test box connector to the test box unit, the unique test box connector ID is used in consulting the generic mate-in interface memory for determining an assignment of the other portion of the contacts into generic level subsets.

According to an embodiment, the specific mate-in interface comprises a specific mate-in interface memory provided at a location on the specific mate-in interface and comprising configuration information for the specific mate-in interface.

According to an embodiment, each one of the specific mate-in interfaces having a unique specific mate-in interface ID, and upon connection of at least one of the specific mate-in interfaces to the generic mate-in interface, the unique specific mate-in interface ID is used in consulting the specific mate-in interface memory for determining an assignment of the contacts in at least one of the generic level subsets into specific mate-in level subsets.

According to an embodiment, each one of the specific mate-in interfaces having a unique specific mate-in interface ID, and a portion of the contacts of the specific mate-in level subsets is reserved for communicating the unique specific mate-in interface ID and another portion of the contacts of the specific mate-in level subsets is reconfigurably assignable and for use in testing at least one of the harness/equipment connectors.

According to an embodiment, the specific mate-in interfaces each comprise an intermediate connector and, wherein the generic mate-in interface further comprises generic connectors which match respectively the intermediate connectors.

According to an embodiment, the generic mate-in interface memory is located on at least one of the generic connectors.

According to an embodiment, there are further provided connection wires between at least some of the contacts of the test box connector and at least some of the contacts of each of the generic connectors.

According to an embodiment, the generic mate-in interface memory is located on at least one of the connection wires of the generic mate-in interface.

According to an embodiment, one intermediate connector has a contact configuration which is different from a contact configuration of another intermediate connector, and wherein the generic connectors each have a different contact configuration for connecting to a respective one of the intermediate connectors having a matching contact configuration.

According to an embodiment, there is further provided a test box connector ID support provided at a location on the generic mate-in interface and comprising a test box connector ID.

According to an embodiment, the test box connector ID support is the generic mate-in interface memory.

According to another aspect of the invention, there is provided a universal mate-in interface kit for enabling a connection between a test box unit and harness/equipment connectors, the kit comprising: a selection of at least two specific mate-in interfaces, each one of the at least two specific mate-in interfaces having, at one end, an intermediate connector connected, at an other end, to specific connectors for connecting to harness/equipment connectors, thereby providing a specific level one-to-many mate-in interface; and a generic mate-in interface having, at one end, at least two generic connectors each for connecting to a respective one of the intermediate connectors of the at least two specific mate-in interfaces, the generic mate-in interface having, at an other end, a test box connector for connecting to the test box unit, thereby providing a generic level one-to-many mate-in interface; at least one memory provided at a location on at least one of the generic mate-in interface and the specific mate-in interface and comprising configuration information for the interface on which the at least one memory is located; wherein having two levels of one-to-many mate-in interfaces provides a greater number of specific connectors available for connecting to the harness/equipment connectors than a single level one-to-many mate-in interface; wherein the test box connector has a unique test box connector ID and contacts, a portion of the contacts being reserved for communicating the unique test box connector ID and an other portion of the contacts being reconfigurably assignable, wherein upon connection of the test box connector to the test box unit, the unique test box connector ID is used in consulting the at least memory for determining an assignment of the other portion of the contacts into subsets; and wherein each one of the specific mate-in interfaces has a unique specific mate-in interface ID and upon connection of at least one of the specific mate-in interfaces to the generic mate-in interface, the unique specific mate-in interface ID is used in consulting the at least one memory for determining an assignment of the contacts in one of the subsets into further subsets.

According to an embodiment, the at least one memory on the generic mate-in interface is located on at least one of the generic connectors.

According to an embodiment, the test box connector comprises contacts and each one of the at least two generic connectors comprise contacts, the kit further comprising connection wires between at least some of the contacts of the test box connector and at least some of the contacts of each one of the at least two generic connectors.

According to an embodiment, the at least one memory on the generic mate-in interface is located on at least one of the connection wires of the generic mate-in interface.

According to an embodiment, one intermediate connector has a contact configuration which is different from a contact configuration of another intermediate connector, and wherein the at least two generic connectors each have a different contact configuration for connecting to a respective one of the intermediate connectors having a matching contact configuration.

According to an embodiment, each one of the specific mate-in interfaces comprises a unique specific mate-in interface ID support comprising the unique specific mate-in interface ID.

According to an embodiment, the unique specific mate-in interface ID support is one of the at least one memory on the specific mate-in interface.

According to an embodiment, the generic mate-in interface comprises a unique test box connector ID support comprising the unique test box connector ID.

According to an embodiment, the unique test box connector ID support is one of the at least one memory on the generic mate-in interface.

According to an embodiment, there is provided a method of using a universal mate-in interface kit for enabling a connection between a test box unit a subject under test, the kit comprising: providing a specific mate-in interface having, at one end, an intermediate connector connected, at an other end, to specific contacts for connecting to harness/equipment connectors of the subject under test, thereby providing a specific level one-to-many mate-in interface; and identifying each of the specific contacts with a unique ID; providing a generic mate-in interface having, at one end, at least two generic connectors each for connecting to a respective one of the intermediate connectors of the specific mate-in interface, the generic mate-in interface having, at an other end, a test box connector for connecting to the test box unit, thereby providing a generic level one-to-many mate-in interface; connecting the test box connector to the test box unit; reading the unique ID of each of the specific contacts with the test box unit; attributing individually an attribute, to each of the specific contacts of the specific mate-in interface read by the text box unit; and performing a selective test on a particular contact of the subject under test based on the attribute.

According to an aspect, attributing individually an attribute is performed by using a computer and attributing the attribute in a database using the computer.

According to an aspect, each of the specific contacts comprises any one of: an alligator clip, a pin, a socket, or a termination made of a conductive material that allows electric contact with another object.

According to an aspect, the generic mate-in interface further comprises a unique test box connector ID support comprising a test box connector ID.

According to an aspect, the unique ID is supported on an electronic device at each of the specific contacts.

According to an aspect, the method further comprises: providing a selection of at least two specific mate-in interfaces, each one of the at least two specific mate-in interfaces having, at one end, an intermediate connector connected, at an other end, to specific connectors for connecting to harness/equipment connectors, thereby providing a specific level one-to-many mate-in interface; and wherein having two levels of one-to-many mate-in interfaces provides a greater number of specific connectors available for connecting to the harness/equipment connectors than a single level one-to-many mate-in interface.

According to an aspect, the test box connector comprises contacts and each one of the at least two generic connectors comprise contacts, the kit further comprising connection wires between at least some of the contacts of the test box connector and at least some of the contacts of each one of the at least two generic connectors.

According to an aspect, the test box connector ID support is electrically accessible from the contacts.

According to an aspect, the test box connector ID support is located on at least one of the generic connectors.

According to an aspect, the test box connector ID support is located on at least one of the connection wires of the generic mate-in interface.

According to another aspect of the invention, there is provided a universal mate-in interface kit for enabling a connection between a test box unit and harness/equipment connectors, the kit comprising: a selection of at least two specific mate-in interfaces, each one of the at least two specific mate-in interfaces having, at one end, an intermediate connector connected, at an other end, to specific connectors for connecting to harness/equipment connectors, thereby providing a specific level one-to-many mate-in interface; and a generic mate-in interface having, at one end, at least two generic connectors each for connecting to a respective one of the intermediate connectors of the at least two specific mate-in interfaces, the generic mate-in interface having, at an other end, a test box connector for connecting to the test box unit, thereby providing a generic level one-to-many mate-in interface, the generic mate-in interface further comprising a unique test box connector ID support comprising a test box connector ID; wherein having two levels of one-to-many mate-in interfaces provides a greater number of specific connectors available for connecting to the harness/equipment connectors than a single level one-to-many mate-in interface; wherein the test box connector has contacts, a portion of the contacts being reserved for communicating the unique test box connector ID and an other portion of the contacts being reconfigurably assignable; wherein upon connection of the test box connector to the test box unit, the unique test box connector ID is used in determining an assignment of the other portion of the contacts into subsets; and wherein each one of the specific mate-in interfaces has a unique specific mate-in interface ID and upon connection of at least one of the specific mate-in interfaces to the generic mate-in interface, the unique specific mate-in interface ID is used in determining an assignment of the contacts in one of the subsets into further subsets.

According to an embodiment, the test box connector ID support is electrically accessible from the contacts.

According to an embodiment, the test box connector ID support is located on at least one of the generic connectors.

According to an embodiment, the test box connector comprises contacts and each one of the at least two generic connectors comprise contacts, the kit further comprising connection wires between at least some of the contacts of the test box connector and at least some of the contacts of each one of the at least two generic connectors.

According to an embodiment, the test box connector ID support is located on at least one of the connection wires of the generic mate-in interface.

According to an embodiment, one intermediate connector has a contact configuration which is different from a contact configuration of another intermediate connector, and wherein the at least two generic connectors each have a different contact configuration for connecting to a respective one of the intermediate connectors having a matching contact configuration.

According to an embodiment, each one of the specific mate-in interfaces comprises a unique specific mate-in interface ID support comprising the unique specific mate-in interface ID.

According to an embodiment, the unique specific mate-in interface ID support is a memory device for storing the unique specific mate-in interface ID.

According to an embodiment, the unique test box connector ID is a memory device for storing the unique test box connector ID.

According to an embodiment, there is provided a method for testing equipment using a test box unit and a mate-in interface having a unique mate-in interface ID, the equipment comprising a plurality of contacts, the method comprising: connecting a mate-in interface to the test box unit; connecting the mate-in interface to the contacts; looking up a connector configuration on the mate-in interface using the unique mate-in ID; testing all contacts to ground; testing all contacts against each other; and automatically creating a list of connections for the equipment based on the testing steps and the connector configuration.

According to an aspect, the step of connecting the mate-in interface to the test box unit comprises: connecting a generic mate-in interface to a harness/equipment connector of the test box unit; and connecting a specific mate-in interface from the generic mate-in interface to the contacts.

According to an aspect, the unique mate-in interface ID is the unique mate-in interface ID of the specific mate-in interface, further comprising obtaining the unique mate-in interface ID of the specific mate-in interface.

According to an aspect, the obtaining is performed by detecting the unique mate-in interface ID of the specific mate-in interface through the generic mate-in interface.

According to an aspect, the obtaining is performed by detecting the unique mate-in interface ID by the test box unit through the mate-in interface.

According to an aspect, the method further comprises obtaining the unique mate-in interface ID of the mate-in interface.

According to an aspect, the obtaining is performed by reading the unique mate-in interface ID on a connector of the mate-in interface.

According to an aspect, the obtaining is performed by detecting the unique mate-in interface ID by the test box unit through the mate-in interface.

According to an aspect, the method further comprises performing an automated test routine based on the list of connections thereby avoiding any programming of the test routine.

According to an embodiment, there is provided a method for testing equipment using a test box unit and mate-in interfaces each having a unique mate-in interface ID, the equipment comprising a plurality of contacts, the method comprising: connecting a mate-in interface to the test box unit; connecting the mate-in interface to the contacts of the equipment; from the mate-in interfaces, selecting a mate-in interface for testing using the unique mate-in interface ID; in the mate-in interface as selected, selecting any one of the contacts for testing; and testing the any one of the contacts of the selected mate-in interface to ground and against each other one of the contacts by inputting a signal and measuring the signal through the selected mate-in interface.

According to an aspect, the method further comprises obtaining the unique mate-in interface ID of the mate-in interface.

According to an aspect, the obtaining is performed by reading the unique mate-in interface ID on a connector of the mate-in interface.

According to an aspect, the obtaining is performed by detecting the unique mate-in interface ID by the test box unit through the mate-in interface.

According to an aspect, the test is used for automatically creating a list of connections for the equipment.

According to an aspect, the step of automatically creating a list of connections for the equipment is based on the unique mate-in interface ID.

According to an aspect, the method further comprises determining, from the unique mate-in interface ID, an assignment for the contacts.

According to an aspect, the determining is performed by consulting a database through the test box unit for the determining of the assignment of the contacts.

According to an embodiment, there is provided a system for testing equipment, the system comprising: a test box unit for testing the equipment; and a mate-in interface for connection to the test box unit; and for connection to contacts on the equipment, the mate-in interface having a unique mate-in interface ID; wherein the test box unit is adapted to: select any one of the contacts for testing; input a signal through the any one of the contacts to ground and measure the signal; and input a signal through the any one of the contacts to any other one of the contacts and measure the signal.

According to an aspect, the mate-in interface comprises: a generic mate-in interface for connection to the test box unit; and a specific mate-in interface for connection to the generic mate-in interface, the specific mate-in interface for connection to the equipment, the specific mate-in interface having the unique mate-in interface ID.

According to an aspect, the test box unit is further adapted to: detect, through the generic mate-in interface, the unique mate-in interface ID of the specific mate-in interface; and automatically create a list of connections for the equipment.

According to an embodiment, there is provided a software-implemented method of reconfigurably assigning a portion of test contacts of a test box unit which is for testing equipment having a harness/equipment connector for connection to a specific mate-in interface, the method comprising: connecting mate-in interface to the test box unit; connecting the mate-in interface to the equipment; obtaining a unique mate-in interface ID of the mate-in interface; and determining, from the unique mate-in interface ID, an assignment of the portion of test contacts.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

The present document describes an assembly for connecting a test unit to a wiring harness or equipment or electrical sub-system to be tested (also referred to herein as a harness/equipment connector), and a method for testing using the assembly. The assembly may comprise a test box unit, a first level (generic level) generic harness connector assembly, and at least one specific second level (specific mate-in level) harness connector assembly. The generic harness connector assembly is for connection to the test box unit on one end, and to the at least one specific harness connectors assembly on the other end. The specific connectors are for testing different existing wiring harnesses or equipment. Each of the generic and specific harness connector assemblies has a specific unique identification (ID). The Information relating to the IDs of the connectors and the contact configuration of each connector is stored in a database of the test unit or test system for identifying the appropriate test contacts that should be used for testing. According to an embodiment, the test box unit is the test unit, but the test system can be controlled by a personal computer.

According to another embodiment, the information related to the contact configuration of each connector of an interface and to the configuration of the interfaces is stored on a memory 200 which is located on the mate-in interface to which relates the information stored thereon. This memory 200 is in replacement or in addition to the memory of the test unit or test system comprising the aforementioned database.

According to an embodiment, the contacts comprise a pin and socket arrangement while in another embodiment it encompasses optical fiber contacts.

The ID for each connector may be permanently stored in a memory device on each connector (e.g., ID support 250 or 252), or elsewhere on the mate-in interface as detailed further below. The ID may also be changeable by updating the information in the memory device. According to another embodiment, the ID may also be on a label on the connector or the ID may be etched on the connector (i.e., it is contained in a static display). In this case, the ID must be read by the technician and entered in the interface to the database to obtain the information relative to the connector at issue.

Figure 1:
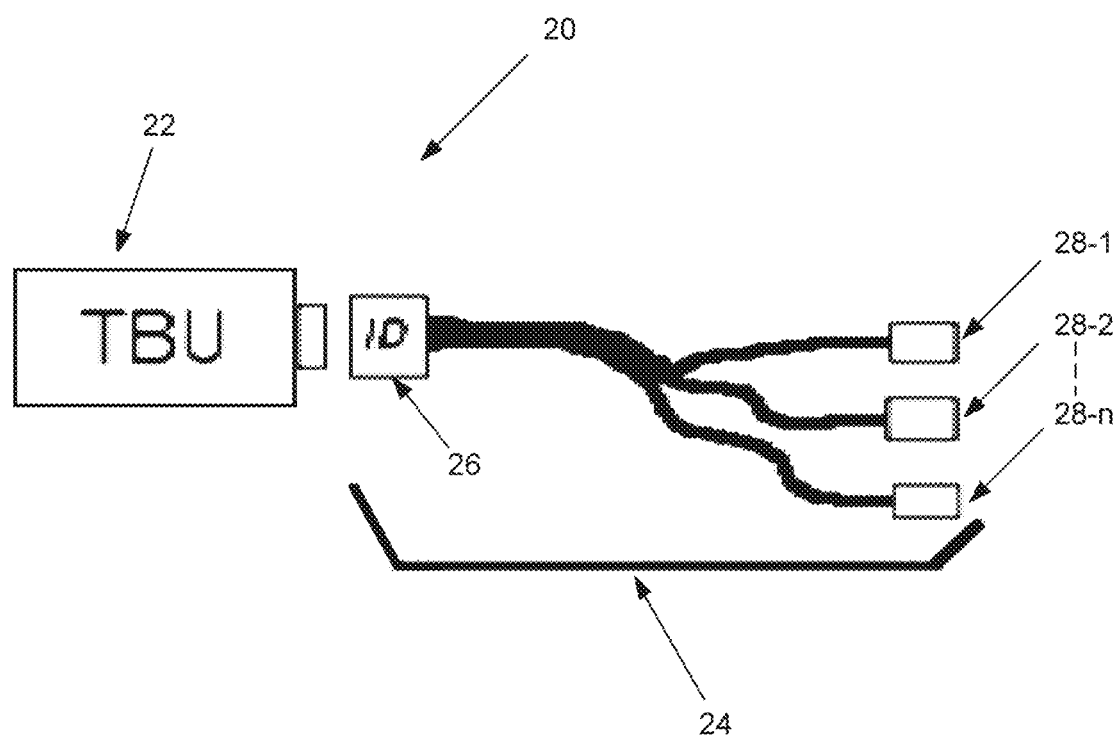
FIG. 1 is a schematic diagram of a conventional assembly for interfacing an existing harness/equipment connector of an installed wiring harness/equipment to a test module.

Co-owned U.S. patent application Ser. No. 12/627,620 filed on Nov. 30, 2009 which is incorporated herein by reference in its entirety, describes an assembly for interfacing an existing harness connector of an installed wiring harness/equipment to a test module. FIG. 1 is a schematic diagram of the assembly described in U.S. patent application Ser. No. 12/627,620. As shown in FIG. 1, the assembly 20 comprises a specific mate-in interface 24 and a test box unit (TBU) 22. The specific mate-in interface 24 includes a TBU connector 26 on one end thereof for connecting to the TBU 22, and a number (n) of specific connectors 28-1 to 28-n for connecting to existing wiring harnesses/equipment that are to be tested (not shown). In this prior art device, the TBU connector 26 is the only location where the identification (ID) of the specific mate-in interface 24 is located. The TBU 22 connects between the TBU connector 26 of the specific mate-in interface 24 and a central test and management unit (not shown). In a test setting, a plurality of TBUs 22 with a specific mate-in interface 24 would be used to connect to different nodes in a wiring harness/equipment.

The number (n) of the specific connectors 28 increases with the number of contacts in the TBU 22. As new wiring harnesses/equipment are always being introduced in the market in cars, planes, houses, etc., new harness/equipment-specific mate-in interface 24 are needed which are able to connect to the new harnesses/equipment using new specific connectors 28. As the number of specific connectors 28 increases, the harness/equipment-specific mate-in interface 24 becomes heavy and hard to manage, and the cost thereof increases too. Furthermore, as the harness/equipment-specific mate-in interface 24 becomes full, new ones have to be built to accommodate new specific connectors 28. The management may become complex, often resulting in two specific connectors 28 required for the test being on different harness-specific mate-in interfaces 24. Therefore, there is a need for an assembly which is simple, provides flexibility in the types and quantities of connectors to which it can interface, and at the same time is more economic for interfacing an existing harness to a test module.

Figure 2:
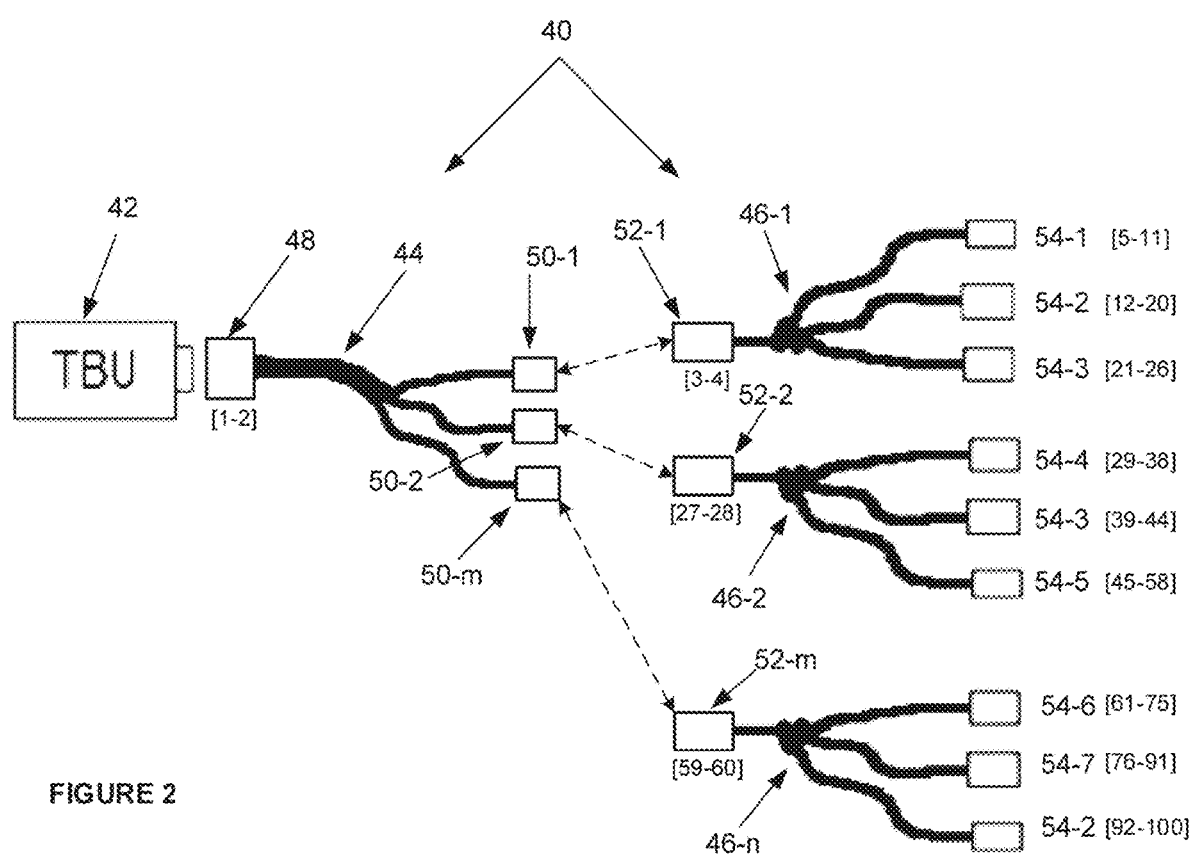
FIG. 2 is a schematic illustration of an assembly for interfacing an existing harness connector to a test module, in accordance with an embodiment.

FIG. 2 is a schematic illustration of an assembly (or universal mate-in interface kit) for interfacing an existing harness/equipment connector to a test module (aka "a TBU 42"), in accordance with an embodiment. As shown in FIG. 2, the assembly 40 comprises a generic mate-in interface 44, and a plurality of specific mate-in interfaces 46-1 to 46-n. The generic mate-in interface 44 comprises a TBU connector 48 for connecting to the TBU 42 and a number (m) of generic connectors 50-1 to 50-m. Each of the specific mate-in interfaces 46 comprises an intermediate connector 52 for connecting to one of the generic connectors 50 at one end, and a plurality of specific connectors 54 for connecting to the existing harness/equipment that is to be tested (not shown).

Figure 6:
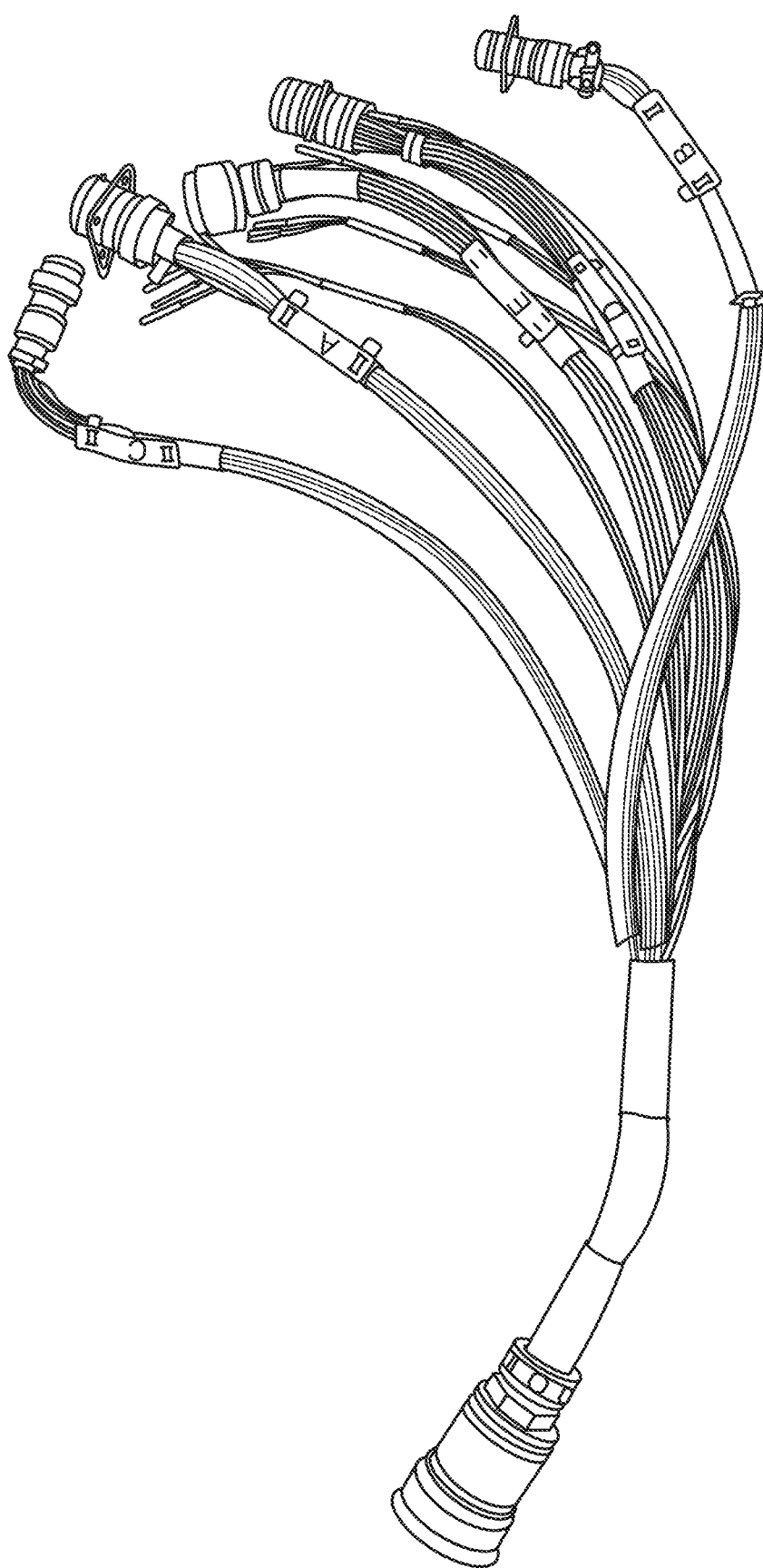
FIG. 6 is a picture of a prior art specific mate-in interface.
Figure 7:
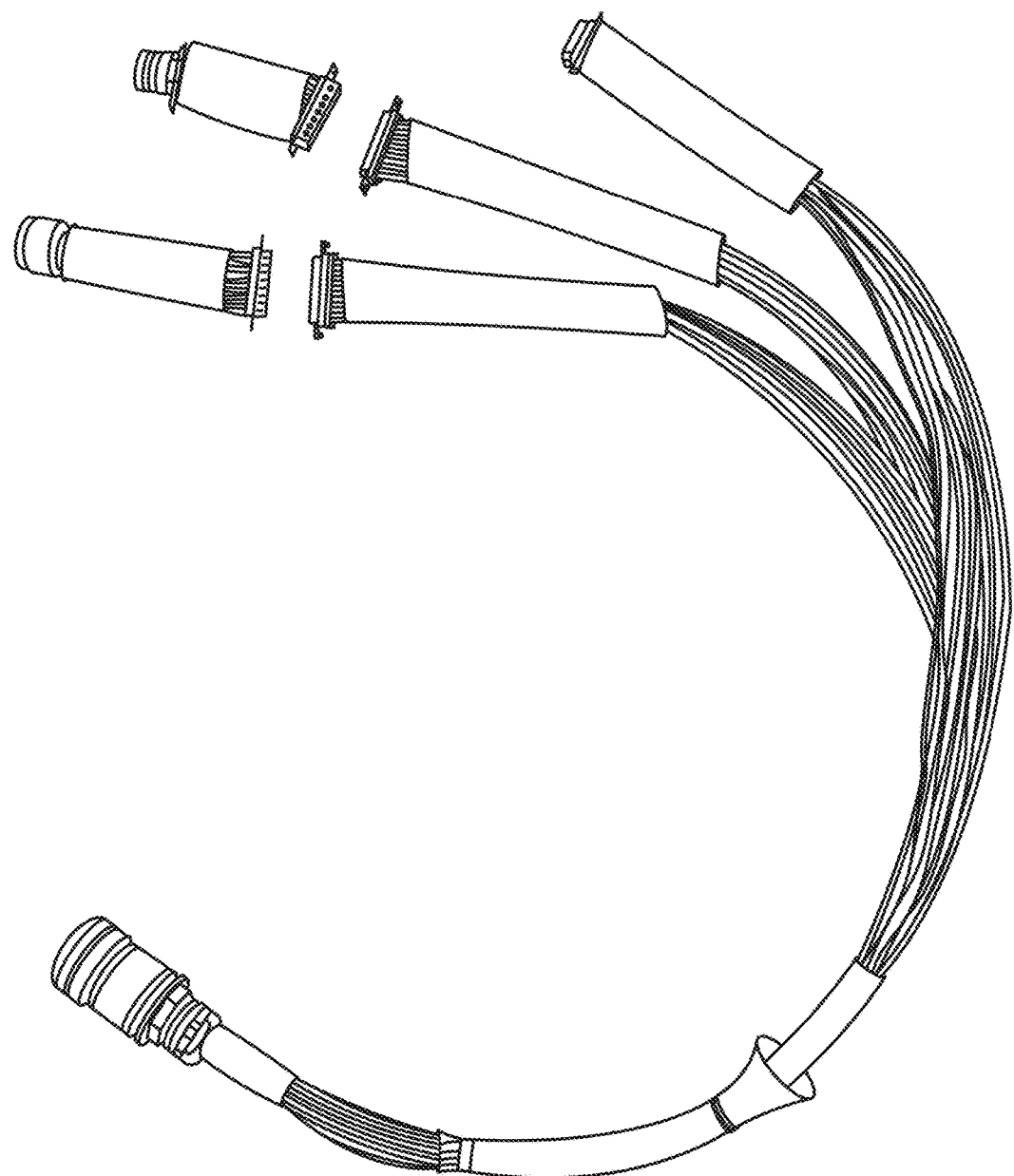
FIG. 7 is a picture of a generic mate-in interface according to an embodiment.
Figure 8:
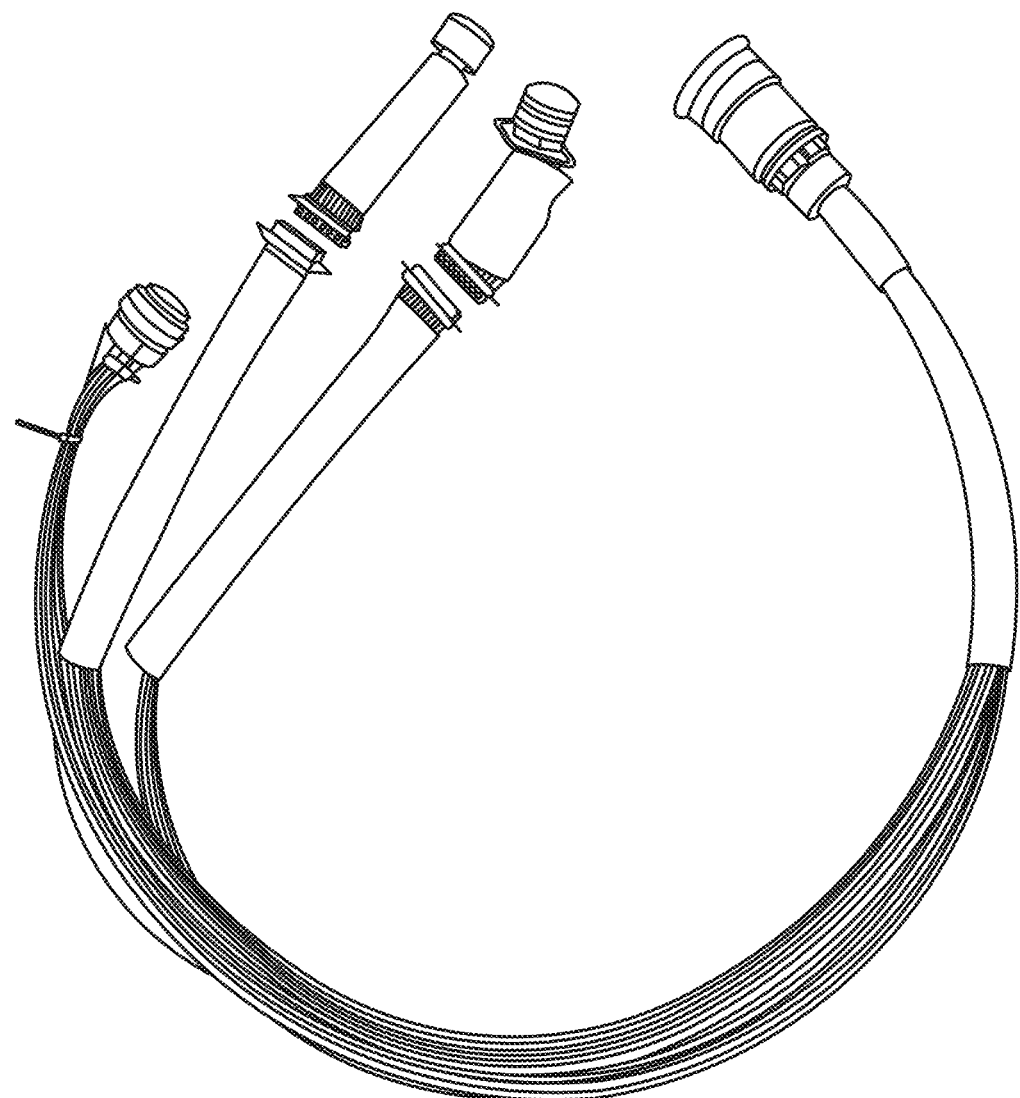
FIG. 8 is a picture of a hybrid mate-in interface according to an embodiment.

In order to appreciate the concepts described herein, FIGS. 6, 7 and 8 are provided. FIG. 6 is a picture of a prior art specific mate-in interface. FIG. 7 is a picture of a generic mate-in interface according to an embodiment and FIG. 8 is a picture of a hybrid mate-in interface according to an embodiment. This last embodiment is hybrid in that it has some generic connectors for connecting to intermediate connectors and some specific connectors for connecting to harness/equipment connectors.

In an embodiment, each generic connector 50 has a specific type e.g. type 1, type 2, type m etc. and may be only be connected to a corresponding type of intermediate connectors 52. For instance, type 1 generic connector 50-1 may be connected to type 1 intermediate connector 52-1, but not to type 2 intermediate connector 52-2.

Each specific connector 54-x of specific mate-in interfaces 46-1 to 46-n is for connection to a specific connector of an existing harness/equipment (not shown). The specific connectors 54 do not have to be exclusive to one type of specific mate-in interface 46. In the embodiment shown in FIG. 2, specific connectors 54-2 is included in specific mate-in interfaces 46-1 and 46-n, and specific connectors 54-3 is included in specific mate-in interfaces 46-1 and 46-2. In an embodiment, the specific connectors 54 are grouped on the basis of the likelihood of using them together. For instance, if a new helicopter includes new types of wiring harnesses which require connectors of the types 64 to 69 (not shown) and old harnesses which require connectors of the types 12 to 19, it is possible to mix and match connectors from the types 12 to 19 and 64 to 69 and provide these in one or more specific mate-in interfaces 46 and interchanged them at any time for a new configuration. The test system may have an auto-detect function that automatically reconfigures the test parameters.

In another embodiment, a generic mate-in interface 44 comprises both one or more generic connectors 50 and one or more specific connectors 54, in which case it is called a hybrid mate-in. In such an embodiment the generic mate-in interface 44 can be used for connecting to specific mate-in interfaces 46 through intermediate connectors 52 or used to connect directly to existing harnesses/equipment.

It is understood that while FIG. 2 only shows one generic mate-in interface 44, generic mate-in interfaces 44 of many can be made to adapt to different intermediate connectors 52 and hence various specific mate-in interfaces 46.

Figure 10:
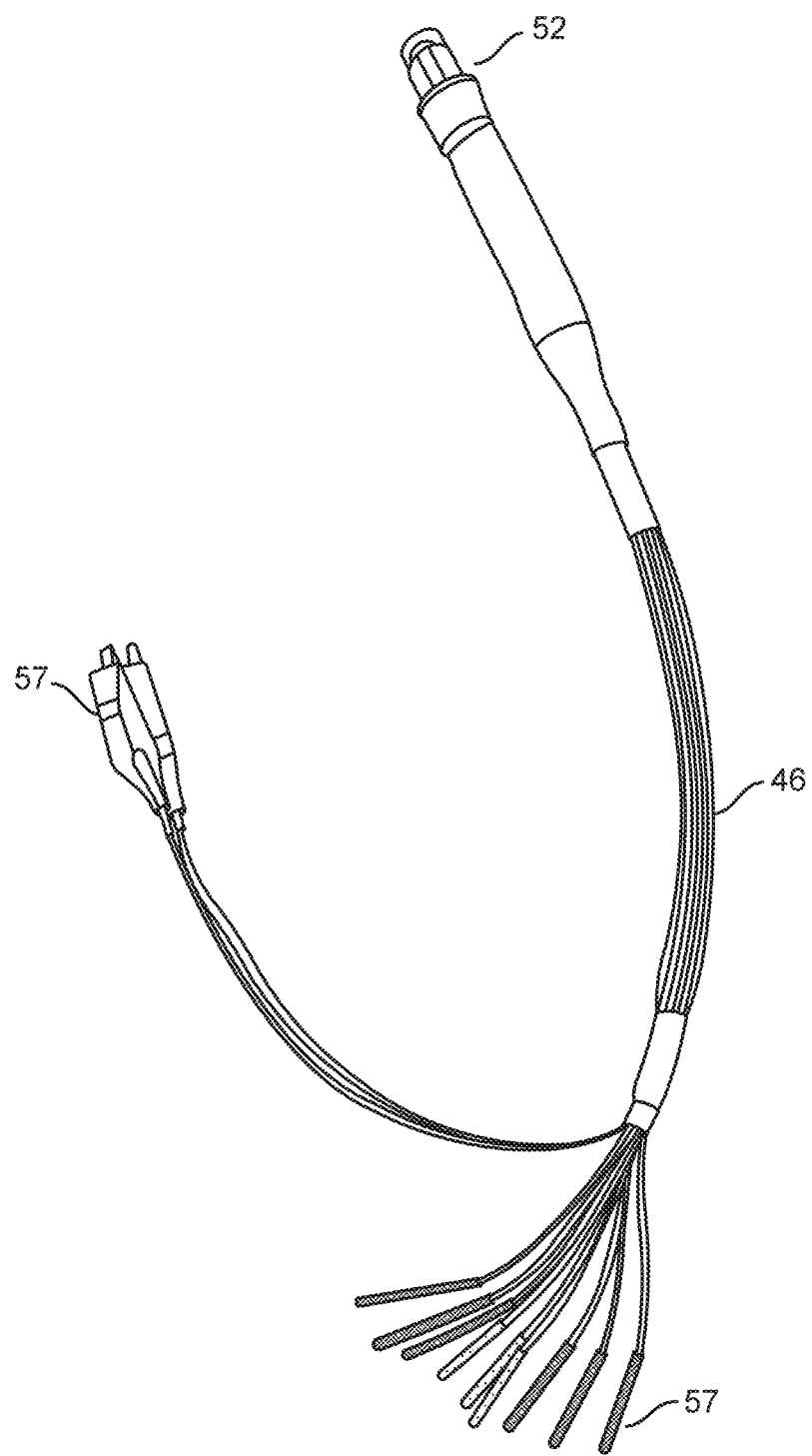
FIG. 10 is a picture of a specific mate-in interface comprising specific contacts.

According to another embodiment, the specific connectors 54 at the end of the specific mate-in interface 46 are replaced by specific contacts 57. Indeed, there might be some cases in which the operator does not have access to the specific connector 54 matching the subject under test. It is also possible that he prefers to make a very selective test on a particular contact of the subject under test and for which the specific connectors 54 would not be appropriate. In such cases, specific contacts 57 would be needed instead of specific connectors 54, as shown in FIG. 10. To perform their task, the specific contacts 57 would have a termination that allows an electric contact with the subject under test, and can thus take the form of an alligator clip, a pin, a socket, or any other termination made of a conductive material that allows electric contact with another object and known to a skilled person to be useful in such a situation. A set of one or more specific contacts 57 can be used at the end of the specific mate-in interface 46. Using specific connector 54 still allows an intermediate mate-in interface 45 to be used.

Figure 4:
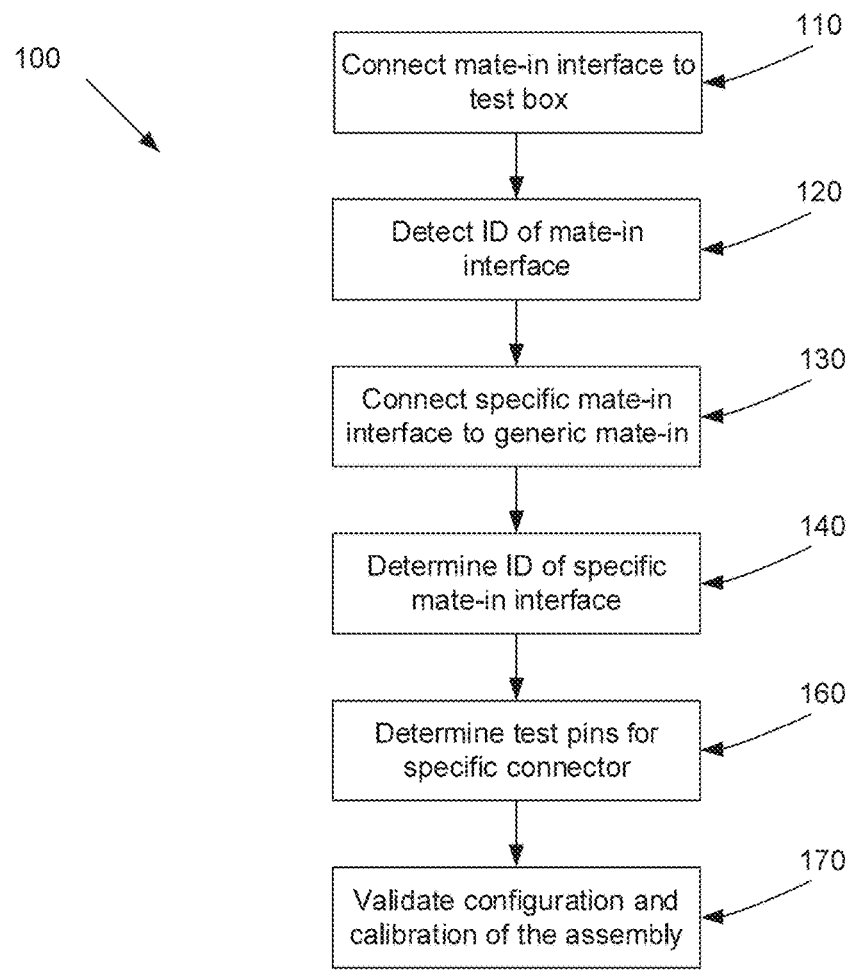
FIG. 4 is a flowchart of a method for detecting the appropriate test contacts in a test unit, when a specific connector is connected to a wiring harness or equipment for testing.
Figure 5:
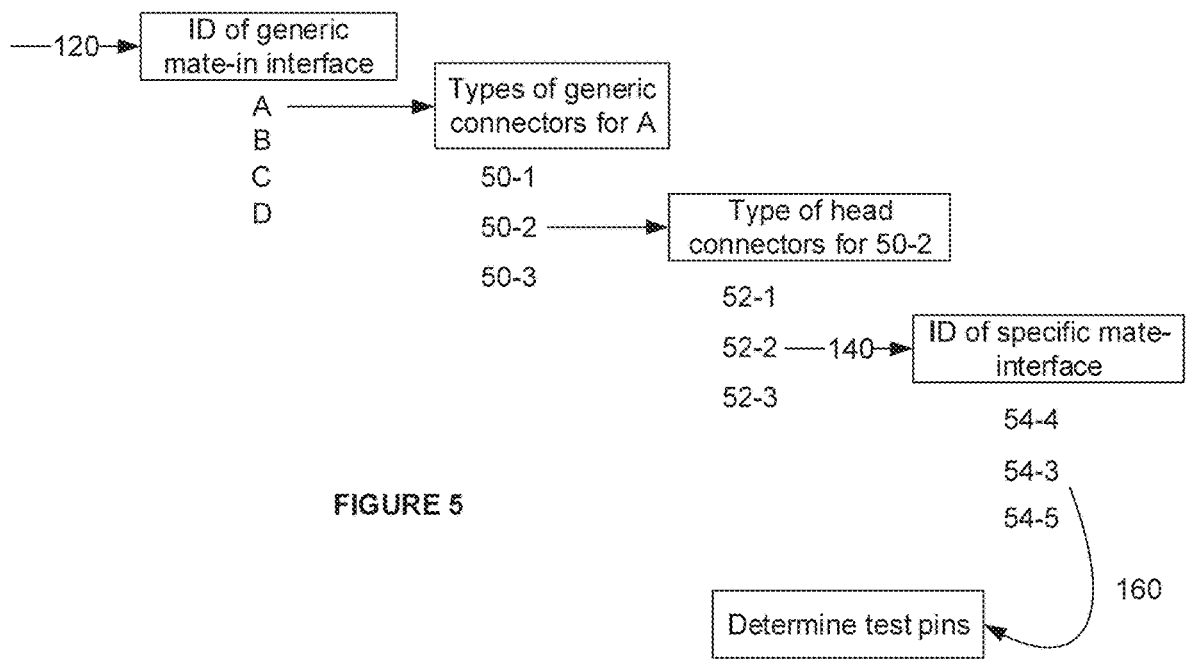
FIG. 5 is an illustration of a data flow within the test unit at each step of the method of FIG. 4.

The step 140 of determining ID of specific mate-in interface, shown in FIGS. 4 and 5 is still valid in this embodiment. This is because the specific mate-in interface 46 still has an intermediate connector 52 and comprises specific contacts 57 instead of specific connectors 54. These specific contacts 57 are properly identified with a unique ID, either manuscript or via an electronic device, with a corresponding contact identification of either the connector identification (letter, number, color, or other alphanumeric or symbolic identifier), the wiring schematic identifier or any other attribute or method as may be determined by the manager of the database.

The manager of the database or the operator of the test will then have the ability to access a software application to refer to such contacts individually in the database and give an attribute to each one of them using his method, in order to get the test results on the same format as in the wiring schematic.

According to another embodiment, an additional interface may be added. This additional interface takes the form of an intermediate mate-in interface 45. Instead of having the generic mate-in interface 44 connecting to the specific mate-in interface 46 using their respective connectors, i.e. generic connectors 50 and intermediate connectors 52, the present embodiment illustrated in FIG. 9 uses the intermediate mate-in interface 45 as a connection between the generic mate-in interface and the specific mate-in interface. This intermediate mate-in interface 45 is characterized by having a generic-to-intermediate connector 51 at one end and an intermediate-to-specific connector 52 at another end.

The use of an intermediate mate-in interface 45 can be useful if the intermediate mate-in interface 45 comprises an input/output connector 55, for example an open or easily accessible wire with a contact for connection. The input/output connector 55 enables the input or the output of a signal inside the circuit. Outputting an electric signal can enable measuring an electric current or a voltage, for example. Inputting an electric signal can comprise applying a voltage or injecting a current. A resistance can also be measured. A relay or another harness component may have to be activated by an electrical source that is not the test box unit 42. For example, a relay could require a 24 V voltage applied by an external electrical source. An electric source or measuring device that is distinct from the test box unit 42 can thus be connected to the input/output connector 55. Optical signals instead of electric signals can also be used for some specific cases. The input/output connector 55 is thus adapted for connection to many types of devices, for example a device adapted to generate a signal, a device adapted to measure an attribute of an electric signal or circuit (voltage, current, resistance), a device using optical signals, a device adapted for analyzing the spectrum of a signal, etc.

The input/output connector 55 may comprise contacts which may be of various types including at least one of pins, sockets, alligator clips, banana plugs, coaxial cables, optical fibers, and a connector adapted to mate with a device adapted for generating a signal or adapted for measuring at least one attribute of a signal or circuit.

According to an embodiment, the intermediate mate-in interface 45 can have a unique ID. The intermediate mate-in interface 45 can also exist in various types depending, for example, on which device is connected to the input/output connector 55. Normally, only one specific mate-in interface 46 can be connected to an intermediate mate-in interface 45.

Figure 12:
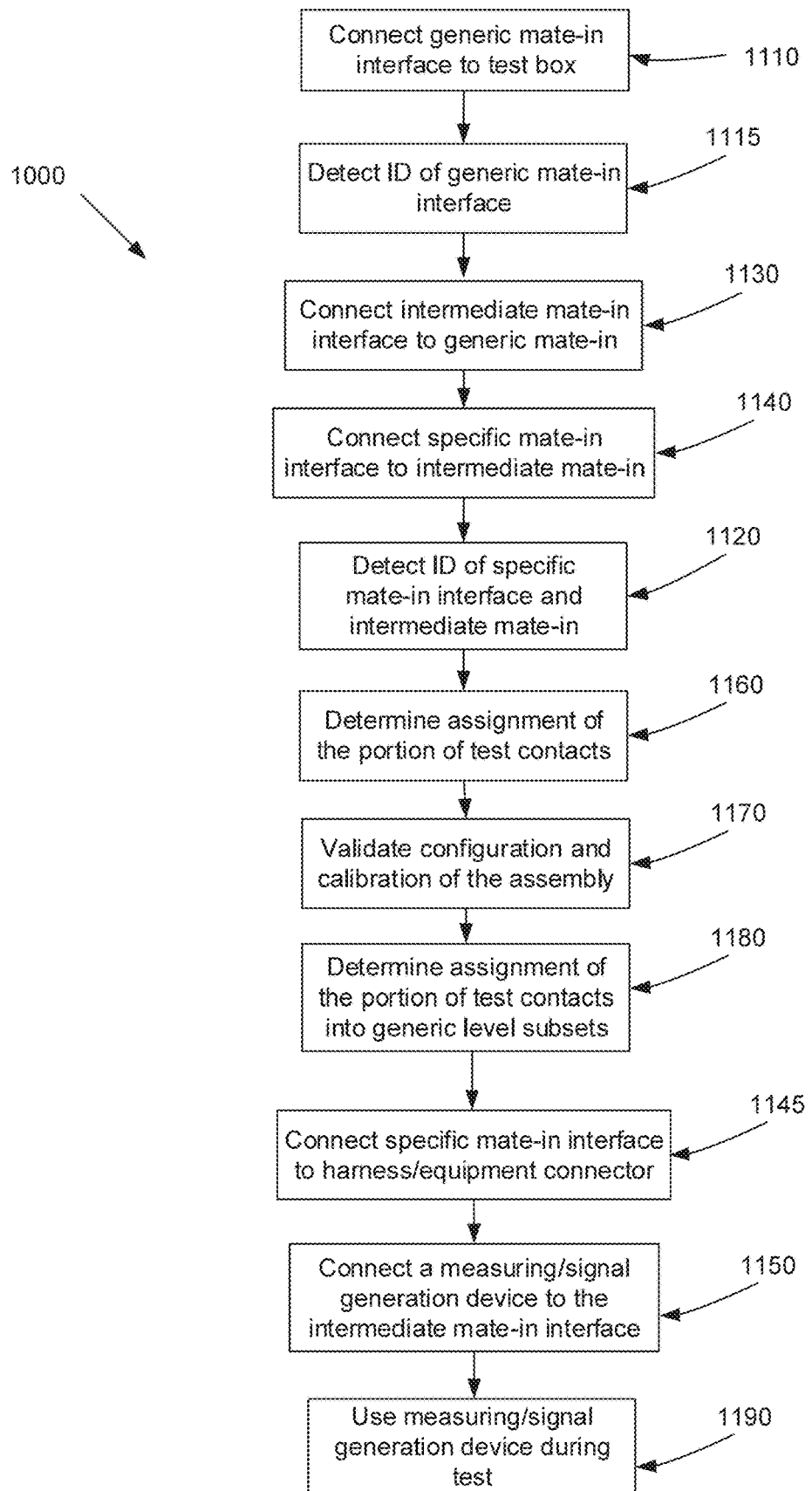
FIG. 12 is a flowchart of a method for testing equipment/harness when an intermediate mate-in interface is used.

FIG. 12 illustrates the steps that need to be performed before the method 1000 of testing equipment having a harness/equipment connector for connection to a specific mate-in interface are executed, when an intermediate mate-in interface is used. Steps 1100, 1130, 1140 and 1145 respectively consist of connecting a generic mate-in interface to test box, connecting an intermediate mate-in interface to the generic mate-in, connecting a specific mate-in interface to the intermediate mate-in interface and connecting the specific mate-in interface to the harness or equipment connector. The step 1150 of connecting a device (such as a signal generator or a measuring device) to the intermediate mate-in interface can also take place.

It may be necessary to reconfigurably assign a portion of test contacts of the test box unit. The assignment of the portion of test contacts is made into a specific mate-in level subset. The generic mate-in interface has a unique test box connector ID. Assigning comprises the steps of:

step 1115: detecting a unique generic mate-in interface ID of the generic mate-in interface after it is connected;

step 1120: detecting, through the generic mate-in interface, a unique specific mate-in interface ID of the specific mate-in interface after it is connected;

step 1160: determining, from the detected unique specific mate-in interface ID, an assignment of the portion of test contacts;

step 1170: validating configuration and calibration of the assembly; and step 1180: determining, from the detected unique test box connector ID, an assignment of the test contacts into generic level subsets wherein one of the generic level subsets comprises the specific mate-in level subset.

Detection of all IDs occurs after all the connections of the mate-in interface are made. Once all the connections and the assignment of a portion of test contacts of a test box unit are made, the test may be performed.

The ID can be stored and/or displayed in/on an ID support 250. According to an embodiment, the unique test box connector ID of the generic mate-in interface 44 is provided in the form of a series of alphanumeric symbols (letters and/or numbers and/or symbols) physically displayed on the generic mate-in interface 44, e.g., written on a sticker, engraved on the generic mate-in interface, displayed on a LCD display, etc. This identifier would therefore be displayed on a static display.

According to another embodiment, the unique test box connector ID of the generic mate-in interface 44 is provided in the form of an electronic device storing the ID and adapted for displaying and/or sending for display the ID. A memory, such as a flash memory or other electrically accessible memory that can be accessed by connecting an electronic device thereto, can be provided with the ID stored therein. The appropriate electrical connector should be provided too. In addition to the memory, an intrinsic display can be provided. The static display mentioned above can also be used in combination with the memory, e.g., if the static display is an LCD display, it can be connected to the memory so the ID stored in the memory is displayed by the LCD display.

The electronic device or memory, the static display, or any combination thereof define a support for displaying and/or storing ID, namely the ID support 250. The ID support 250 can be provided at any location on the generic mate-in interface.

Figure 13:
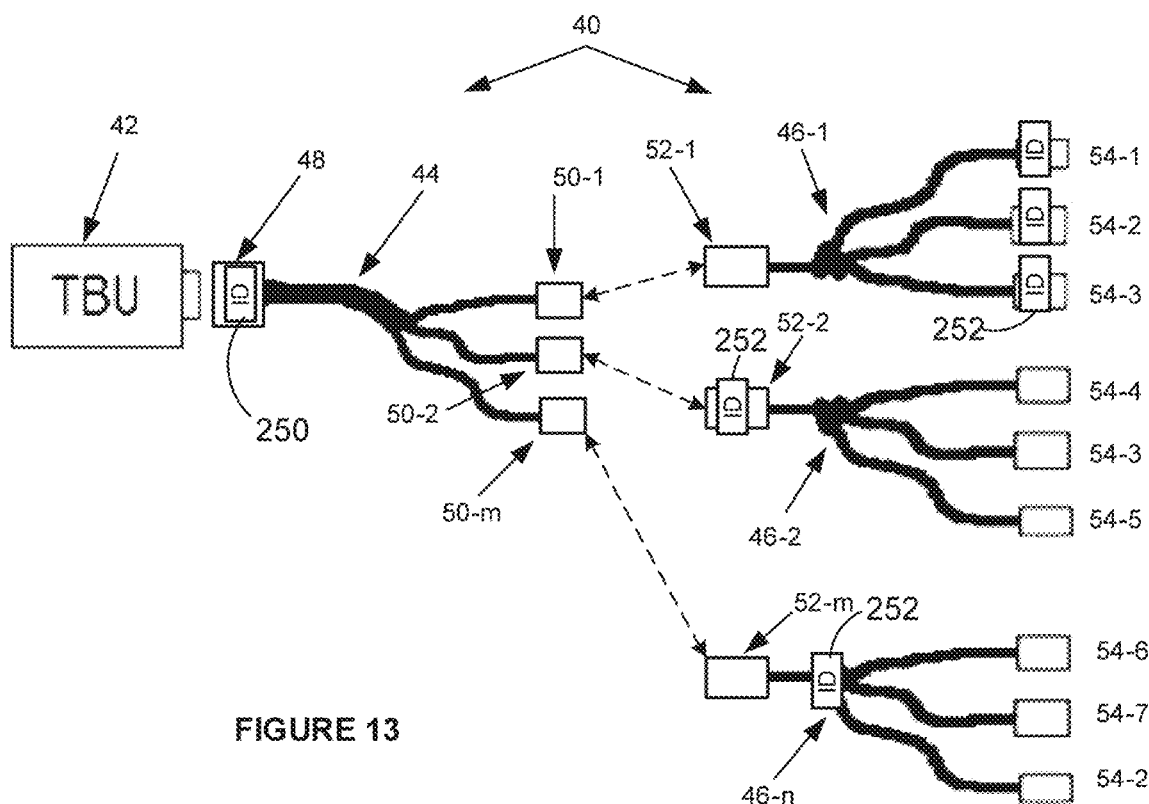
FIGS. 13-15 are schematic diagrams illustrating different embodiments of an assembly for interfacing an existing harness connector to a test module with ID displayed on an ID support provided at various locations on the assembly.
Figure 16:
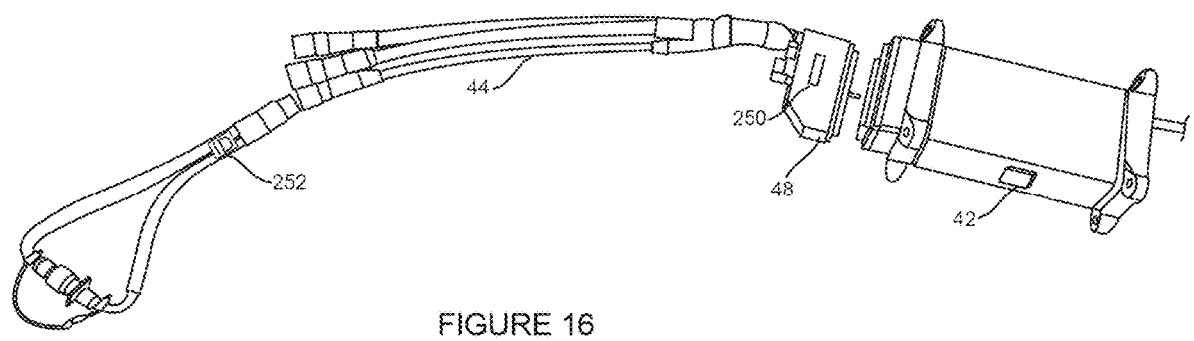
FIG. 16 is a picture illustrating an embodiment of an assembly for interfacing an existing harness connector to a test module with interface ID displayed on an ID support provided at two locations on the assembly.

According to an embodiment, the unique test box connector ID support 250 is provided on the test box connector 48, as shown in FIG. 13 and on the exemplary picture of FIG. 16.

Figure 14:
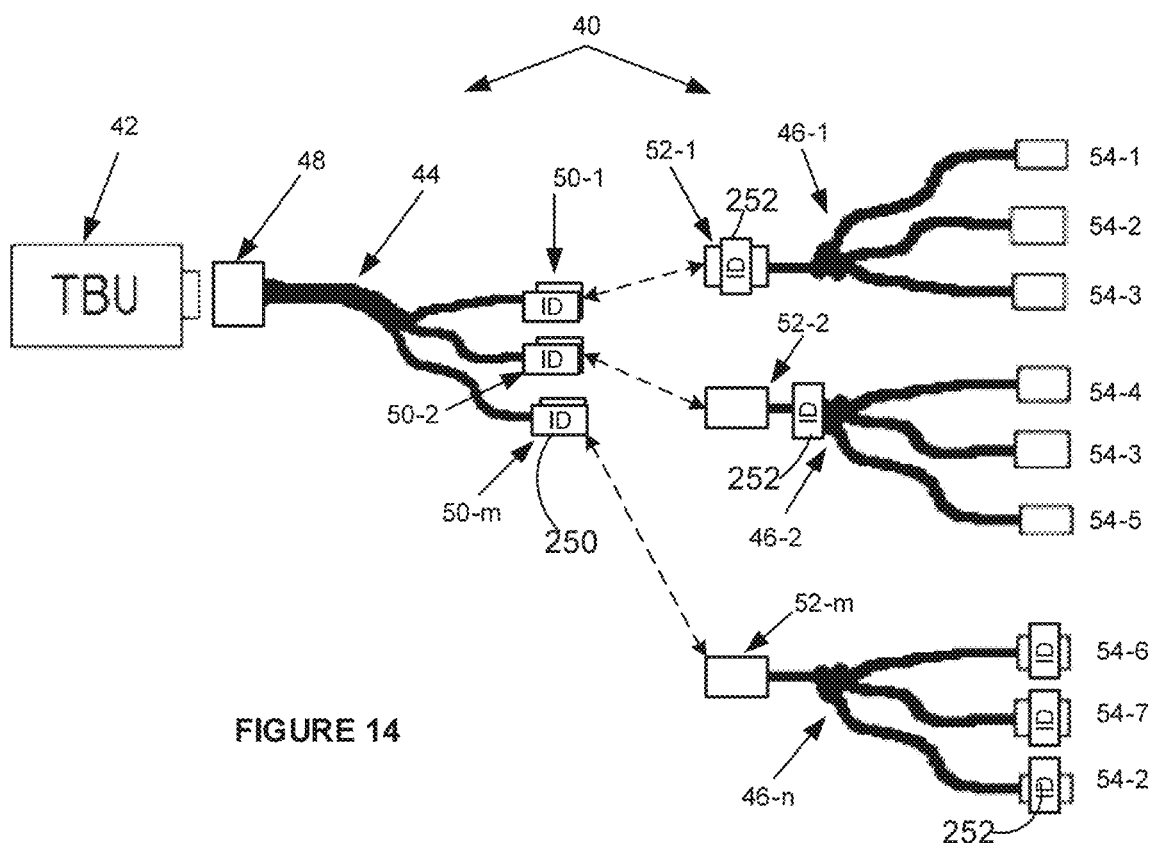

According to another embodiment, the unique test box connector ID support 250 is provided on the generic connector 50, as shown in FIG. 14.

Figure 15:
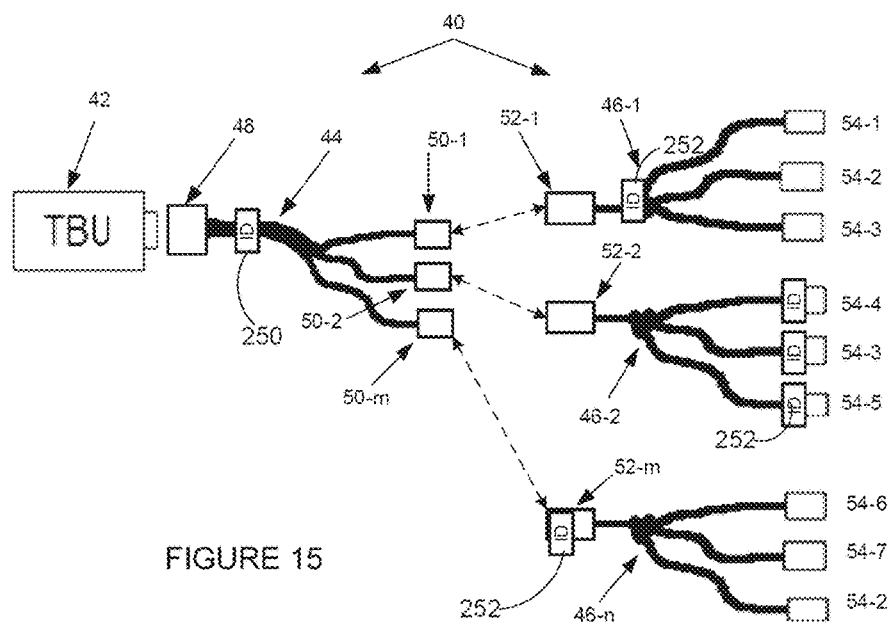

According to another embodiment, the unique test box connector ID support 250 is provided anywhere on the generic mate-in interface 44. The generic mate-in interface 44, in addition to the connectors, comprises wires. The ID support 250 can therefore be provided on (or wrapped around) the wire making up the elongated portion of the generic mate-in interface, at any suitable or convenient location thereon, as shown in FIG. 15.

Regarding the specific mate-in interface 46, there can also be a unique specific mate-in interface ID support 252 provided at any suitable or convenient location thereon. In the prior art, the ID was found in the most proximal connector. For example, the ID of the specific mate-in interface 24 shown in FIG. 1 is located the TBU connector 26. The ID support 252 for containing/displaying the ID of the specific mate-in interface 46 may be a static display and/or an electrically accessible memory as for the ID support 250 of the generic mate-in interface 44.

The unique ID support 252 for the specific mate-in interface 46 can be provided at any suitable or convenient location thereon, including the intermediate connector 52, the wiring itself, and/or the specific connector 54. FIGS. 13-15 show these different possibilities in combination with the various possibilities for the ID support 250 of the generic mate-in interface 44.

As noted above, an intermediate mate-in interface is required when a signal or a measure implying a device that is distinct from the test box unit is needed. Such a device (such as a signal generator or a measuring device) that was connected at step 1150 can be used at step 1190, for example for applying a voltage, injecting an electric current, or measuring a voltage, a resistance or an electric current.

Figure 9:
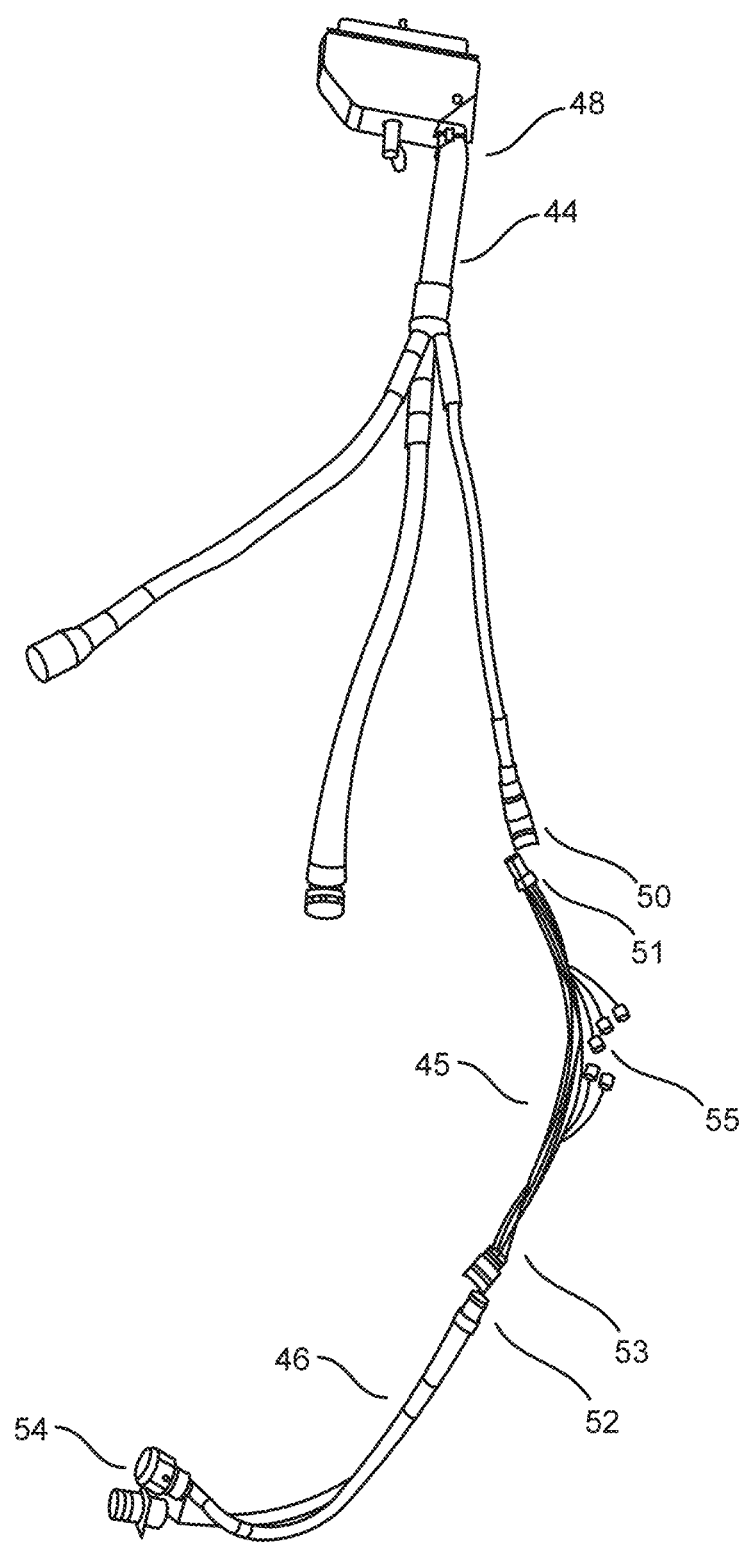
FIG. 9 is a picture of an intermediate mate-in interface connected between a generic mate-in interface and a specific mate-in interface.
Figure 11:
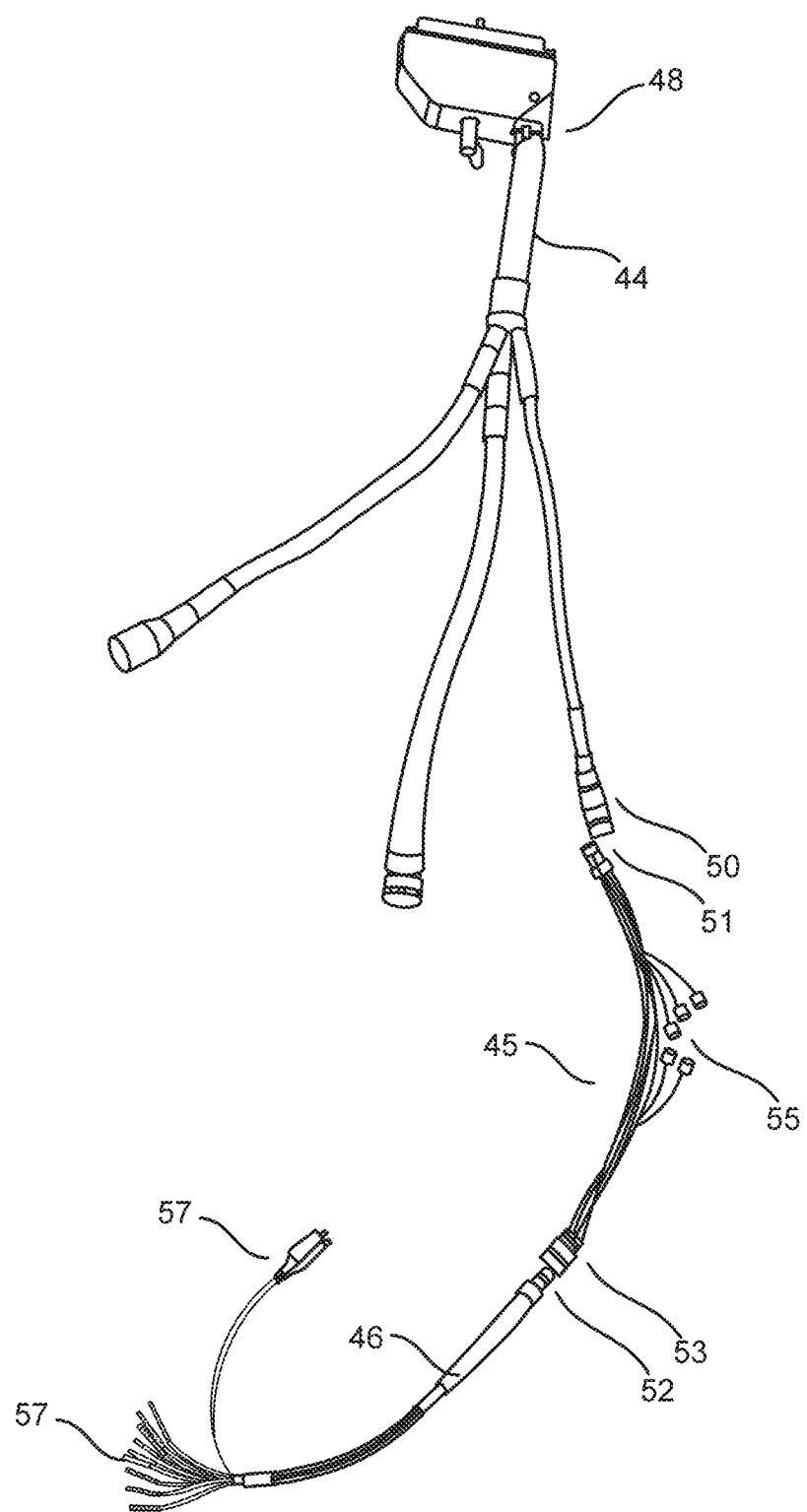
FIG. 11 is a picture of an intermediate mate-in interface connected between a generic mate-in interface and a specific mate-in interface comprising specific contacts.

In an embodiment, specific contacts 57 may be used instead of specific connectors 54 when an intermediate mate-in interface 45 is used (as in FIG. 9). This configuration is illustrated in FIG. 11.

Contact Configuration

With the multitude of specific connectors 54, and the possibility of including the same type of specific connector 54 in more than one specific mate-in interface 46, a configuration system (not shown) is required which allows the TBU 42 to perform the testing of the same type of harness/equipment connector using different contacts of the TBU 42. In an embodiment, a number of the contacts are dedicated to identifying the type of the generic mate-in interface 44 and the type of the specific mate-in interfaces 46 used for connecting the TBU 42 to the existing harness.

In some circumstances, a technician will be testing a single specific connector on a wiring harness or equipment. Therefore, only the specific mate-in interface 46 having the specific connector 54 needed to connect to the specific connector on the wiring harness/equipment would be connected to the generic mate-in interface 44. In other circumstances, a technician may need many connectors at different locations on the infrastructure to be tested and he will need flexibility to structure the mate-in in the most efficient contact allocation for the use of his test unit. Therefore, he would use a combination of specific, generic and hybrid mate-ins to accommodate all of the connectors required at the proper locations, and the test system would reconfigure itself automatically by reading the ID as required.

Using the ID of generic mate-in interface 44, the assignment of the contacts for TBU connector 48 can be determined by looking up its contact assignment in a lookup table in a database. A memory 200 may be used in replacement or in addition to the database stored on a memory of the test unit. The ID of generic mate-in interface corresponds to the unique test box connector ID which is used in determining an assignment of a portion of the contacts into generic level subsets. Again, it is most probable that not all generic connectors 50 will be connected to an intermediate connector 52 at the same time. Knowing the contact assignment for TBU connector 48, the TBU 42 can scan the contacts assigned for ID purposes to identify which of the specific mate-in interfaces is connected. The unique specific mate-in interface ID is used in determining an assignment of the contacts in at least one of the generic level subsets into specific mate-in level subsets. The technician would then specify what test he wants to perform and the test unit would automatically know which contacts to use on TBU connector 48.

The memory 200 comprising configuration information for the mate-in interfaces and for their contacts can be provided at various locations on the mate-in interfaces, as long as the memory 200 is electrically accessible.

Figure 17:
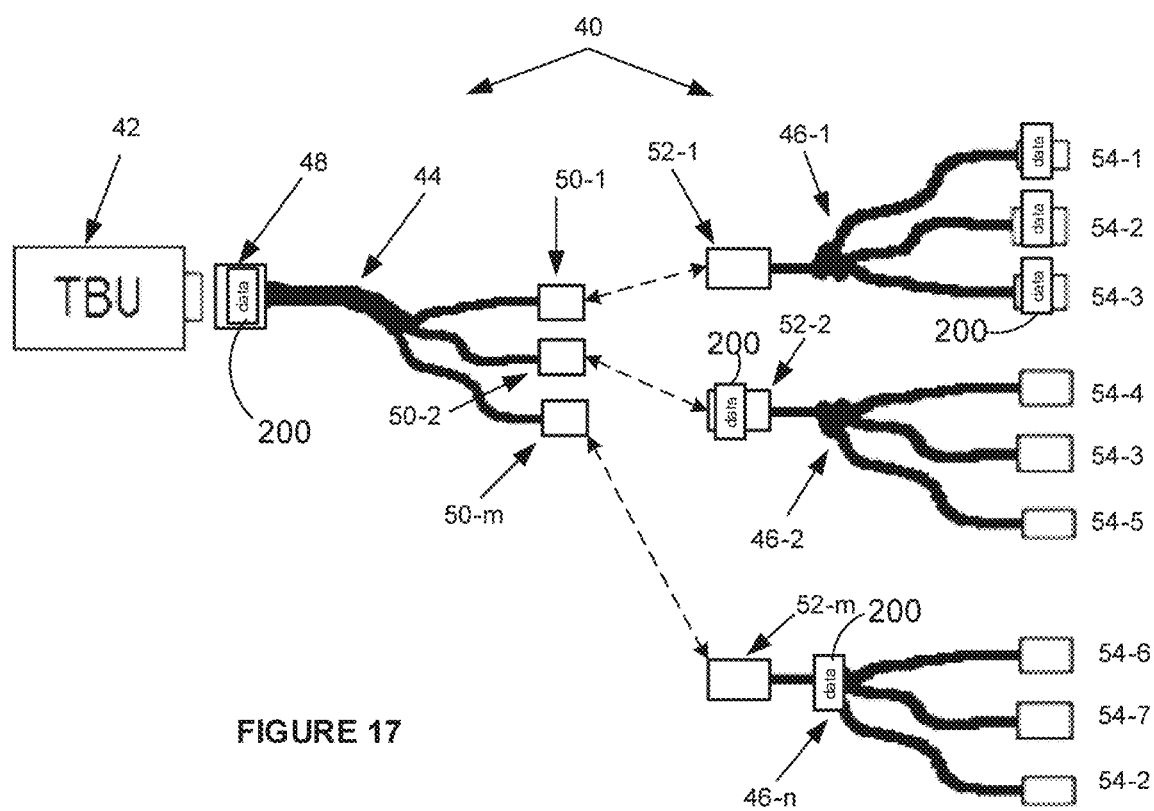
FIGS. 17-19 are schematic diagrams illustrating different embodiments of an assembly for interfacing an existing harness connector to a test module with a memory provided at various locations on the assembly and comprising configuration data.
Figure 18:
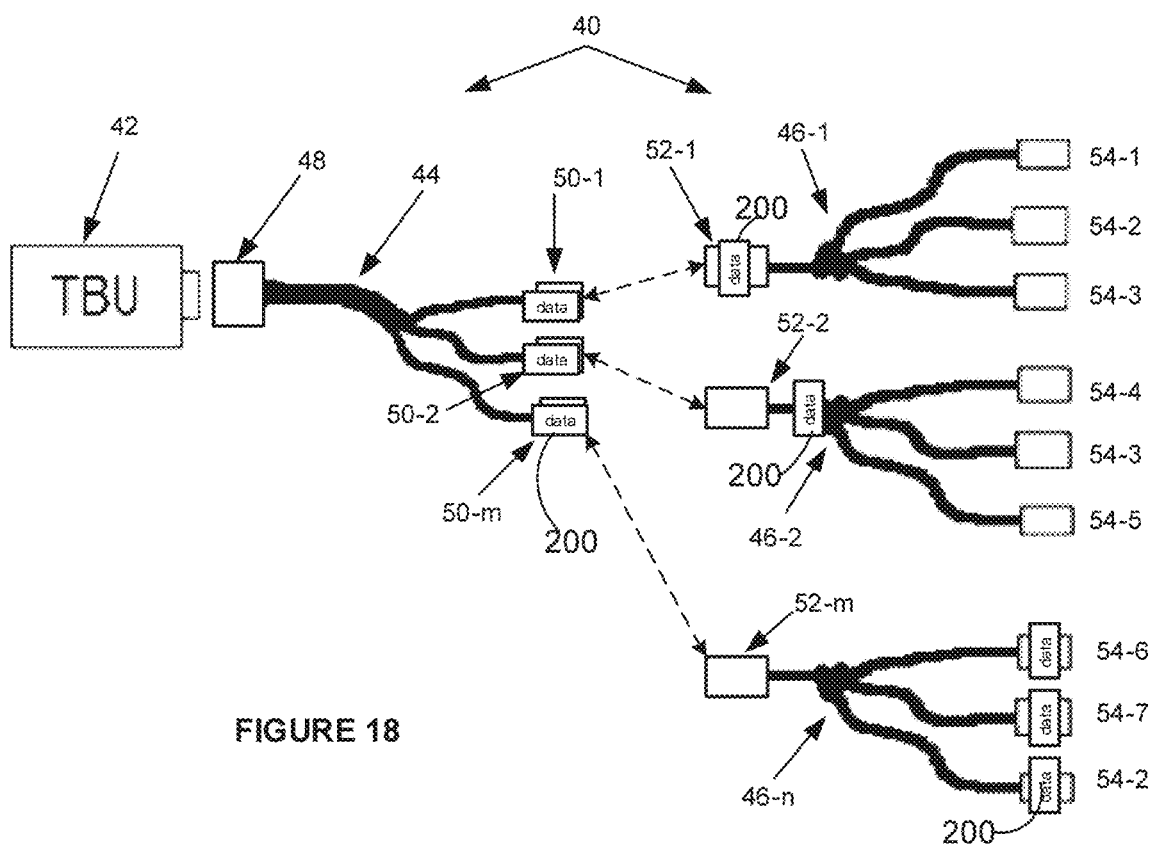
Figure 19:
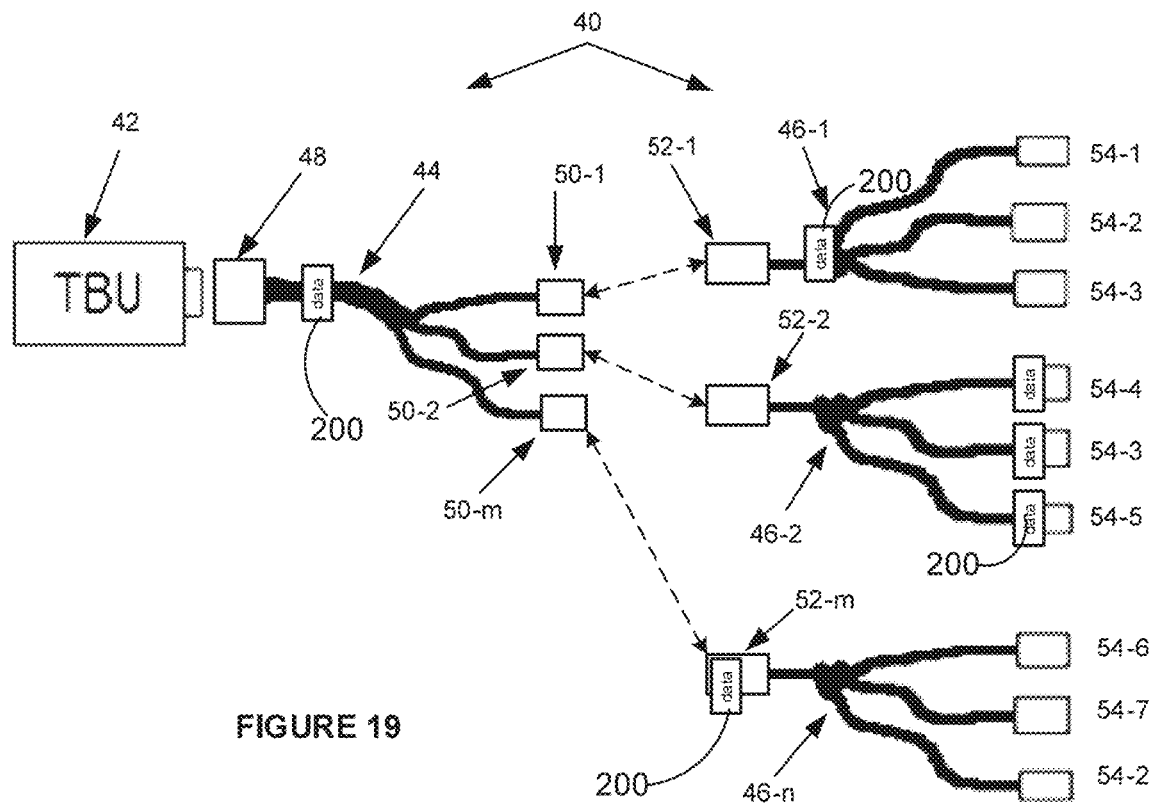
Figure 20:
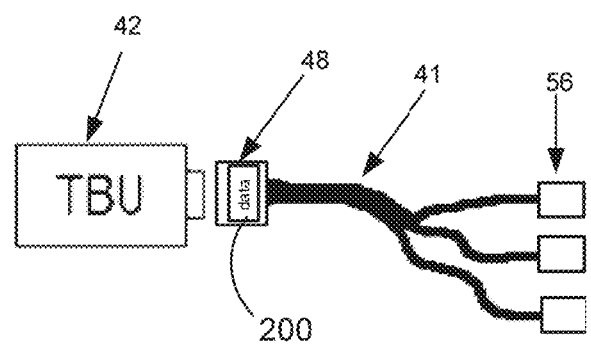
FIGS. 20-22 are schematic diagrams illustrating different embodiments of a generic mate-in interface, for connection to a test module, with a memory provided at various locations on the assembly and comprising an ID and configuration data.
Figure 21:
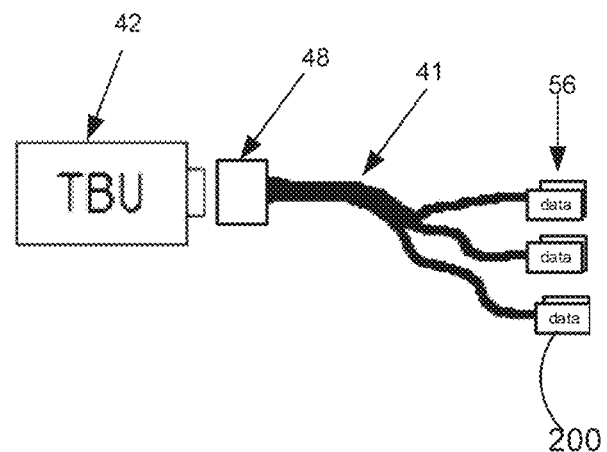
Figure 22:
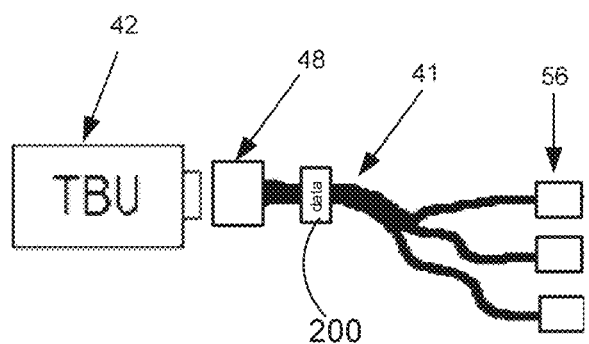

The same locations as the ID supports 250, 252 can be considered for the memory 200. For example, the memory 200 installed on a given mate-in interface can be installed on its most proximal connector (i.e., TBU connector 48 or intermediate connector 52), distal connector (generic connector 50 or specific connector 54), or on the wiring between these connectors. These various cases are illustrated in FIGS. 17-19, where the memory 200 is installed at these various locations.

According to an embodiment, the generic mate-in interface memory (i.e., the memory 200 on the generic mate-in interface) is the same device as the ID support 250.

According to an embodiment, the specific mate-in interface memory (i.e., the memory 200 on the specific mate-in interface) is the same device as the ID support 252.

Some mate-in interfaces may have no memory 200 as long as the required configuration information is accessible.

Again referring to FIG. 2 and using the contact numbers in brackets [ ], an example is given here of a possible contact assignment for a generic mate-in interface 44. In the case of a generic mate-in connector 44 comprising three generic connectors 50-1, 50-2, and 50-m, and a TBU 42 including 100 contacts, it is possible to assign the contacts as follows:

Contacts 1 and 2 for identifying the generic mate-in interface 44 and hence the assignment for the rest of the contacts, more specifically the layout of contacts 3-4, 27-28 and 59-60 to determine the specific type of the intermediate connectors 50-1/52-1 to 50-m/52-m;

Contacts 3 and 4 for identifying the specific mate-in interface 46-1;

Contacts 5 to 26 for testing using generic connector 50-1 and intermediate connector 52-1. Therefore, in the corresponding specific mate-in interface 46-1 the configuration of contacts may be as follows:

Contacts 5 to 11 may be dedicated to specific connector 54-1;

Contacts 12 to 20 may be dedicated to specific connector 54-2; and

Contacts 21 to 26 may be dedicated to specific connector 54-3.

Contacts 27 and 28 for identifying the specific mate-in interface 46-2;

Contacts 29 to 58 for testing using generic connector 50-2 and intermediate connector 52-1. Therefore, in the corresponding specific mate-in interface 46-2 the configuration of contacts may be as follows:

Contacts 29 to 38 may be dedicated to specific connector 54-4;

Contacts 39 to 44 may be dedicated to specific connector 54-3; and Contacts 45 to 58 may be dedicated to specific connector 54-5.

Contacts 59 and 60 for identifying the specific mate-in interface 46-n;

Contacts 61 to 100 for testing using generic connector 50-m and intermediate connector 52-m. Therefore, in the corresponding specific mate-in interface 46-n the configuration of contacts may be as follows:

Contacts 61 to 75 may be dedicated to specific connector 54-6;

Contacts 76 to 91 may be dedicated to specific connector 54-7; and

Contacts 92 to 100 may be dedicated to specific connector 54-2.

As seen, in the example described above, the same number of contacts is assigned to specific connectors having the same type. For instance, specific connector 54-2 is assigned 8 contacts (12 to 20) in specific mate-in interface 46-1, and also 8 contacts (92 to 100) in specific mate-in interface 46-n. The same applies specific connector to 54-3 in specific mate-in interfaces 46-1 and 46-2.

It should be noted that the example discussed above is for descriptive purposes only. The design is not limited to the details presented in this example. Several elements may be different than what is discussed in this example including but not limited to:

The number and/or configuration of contacts in the TBU 42;

The type and configuration of generic mate-in interface 44;

The number and model of generic connectors 50 in the generic mate-in interface 44;

The model and configuration of contacts in each of connectors 48, 50, 52, and 54;

The number of specific mate-in interfaces 46; and

The number of specific connectors 54 in the specific mate-in interfaces 46.

Each of the specific connectors has a specific auto-calibration cap (not shown) that serves 3 purposes. The first purpose is to act as a protection against the elements (dust, grease, shock, etc.,). The second purpose is to act as a loop circuit to ensure integrity of contacts. The third purpose is to act as a calibration tool for the measurements of resistance, impedance or TDR. This cap includes a small printed circuit board (or other form of medium) that permits a continuity test of all of the contacts of the specific connectors to verify their integrity with their contact layout and ground, as well as a measure of the configuration of the assembly of the mate-in assembly 40 to be considered (for example, removed in the case of resistance) in the measurement of the test subject.

Method of Testing

Configuration information relating to the number and classification of the contacts in each type of generic mate-in interface 44, and specific mate-in interfaces 46, is stored in a database of the central test and management unit 70 described along with FIG. 3 below in order for the central test and management unit 70 to determine the appropriate contacts for testing. In the example discussed above if the user is testing a wiring harness with specific connector 54-3 of specific mate-in interface 46-2, the test unit needs to know that testing should be effected on contacts 39 to 44 of the test box connector 48 which are dedicated to specific mate-in interface 46-2.

Figure 3:
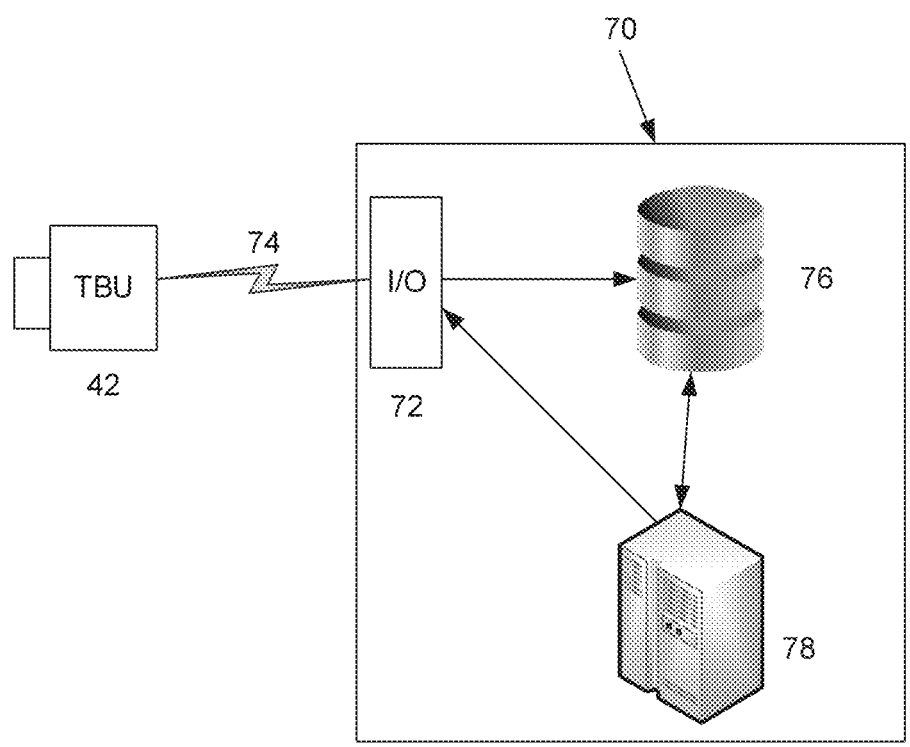
FIG. 3 is a block diagram of a test unit in accordance with an embodiment.

FIG. 3 is a block diagram of a test unit and management unit 70 in accordance with an embodiment. The test unit and management unit 70 includes an input output module (I/O) 72 which is responsible for sending/receiving information with the TBU 42 by means of a wired and/or wireless connection 74, and outputting the test results on a user interface for display to the user either directly on TBU 42 or on an external interface (not shown). The test unit and management unit 70 comprises a database 76 which stores the configuration information of the contacts and the connectors, and a processor for performing the test using the information stored in the database.

FIG. 4 is a flowchart of a method 100 for detecting and assigning the appropriate test contacts in a test unit, prior to starting the testing process. The method described herein can be embodied as a software application residing on TBU 42 or in the central test and management unit 70. FIG. 5, is an illustration of a data flow within the test unit and management unit 70 at each step of the method 100.

At step 110, a mate-in interface is connected to the TBU. After connection of the mate-in interface to the TBU, the ID of the test box connector of the mate-in is detected (step 120) to determine the ID of the mate-in interface connected directly to the TBU 42. With step 120, it is possible to determine if the mate-in interface is a specific mate-in interface 24, or a generic or hybrid mate-in interface 44 that is connected to the TBU.

Each generic mate-in interface 44 has a specific ID. A list of the IDs along with the configuration information associated with each ID may be stored in the database 76. In the contact assignment exemplified above, step 120 may be performed by reading contacts 1 and 2 to determine the ID of the generic mate-in interface 44. Physically, each of the generic connectors 50-1 to 50-*n* on the generic mate-in interface 44 may be identified as A, B, C, D, etc. The technician will choose and connect the specific connectors 54 by selecting them in the type available from the intermediate connector 52 on any mate-in available, and note the assignment based on the ID and letter of the mating for test assignment. With step 120, the test system look-up table provides the configuration of the generic mate-in interface 44.

At step 130, at least one specific mate-in interface is connected to the generic mate-in interface. At step 140, the processor finds out the ID of specific mate-in interfaces 46 connected (if any) to the previously identified generic mate-in interface 44 (by reading contacts 3 and 4, 27 and 28, and 59 and 60 in this exemplary embodiment).

Assuming that specific mate-in interface 46-2 and that contacts 27 and 28 provide the ID for specific mate-in interface 46-2, the processor then looks up the list of specific connectors 54 associated with a type 2 specific mate-in interface 46-2 at step 140. Assuming that the specific connector 54 which will be used for testing is a type 3, the processor then moves to step 160 to look up the contact configuration in the database 76 to determine the test contacts associated with specific connector 54-3 when this specific connector is provided in a type 2 specific mate-in interface 46, which is connected to a type 2 generic connector 50 of a type A generic mate-in interface 44. Once the test contacts are determined the test unit may begin testing. In an embodiment, all of these steps are performed automatically.

Finally, a last step (step 170) is to validate the configuration and calibration of the assembly prior to initiating a test sequence.

With the configuration of the specific connectors 54 in relation to the test unit connector 48 completed and validated, and the automation process noted previously, an automated test program based on the specific connectors 54 used and their configuration as noted in the test system database can now be performed. This procedure eliminates the need for manual programming of test programs. For example, the technician would create and assign the name of the specific connectors 54 used for the test as specified in the wiring diagram of the electrical sub-system under test, and the test and management unit 70 would automatically test all contacts to ground of equipment under test, and then test all contacts of all harness/equipment connectors used against all other contacts of the harness/equipment connectors used for the test, and therefore to be able to create a list of connections for the electrical sub-system, and measure specific electrical characteristics of each node.

With regard to the size and weight, it should be noted that the length of a specific mate-in interface 46, may be in the order of few centimeters while the generic mate-in interface may be longer (one meter or more) to accommodate many specific connectors at a same location. Using the prior art system, if a technician needs three (3) specific connectors 54 which are on three (3) different specific mate-in interfaces which he has in stock, he will have to bring three specific mate-in interfaces with him to a test job. If each specific mate-in interface has nine (9) possible specific connectors 54, he would be bringing 27 specific connectors 54 to a job requiring only three specific mate-in connectors each having a hundred wire cable of more than a meter. This is very cumbersome. With the generic mate-in interface 44 proposed herein on the other hand, he would bring one or more generic mate-in interface 44 which can adapt to the one, two or three (at most in this example) short specific mate-in interfaces. Therefore, instead of carrying a plurality of heavy conventional specific mate-in interfaces 24 with many specific connectors 28 useless for his test, the technician may select the required specific mate-in interfaces 46 based on the specific connectors needed, and a single or very few corresponding generic mate-in interface 44 before going to testing site.

With regard to the costs and maintenance, the present embodiments allow the user to buy a reduced number of specific connectors that they need without having to pay for un-necessary connectors. For instance, if a certain user performs testing of a certain type of plane or car, the user has no use for the other connectors provided by default on a specific mate-in interface.

Furthermore, the cost for repairing/replacing a damaged generic or specific mate-in interface according to the present embodiments is way cheaper than having to replace or repair a conventional specific mate-in interface 24 with many of the specific connectors 28.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. An assembly for interfacing an existing harness connector of an installed wiring harness to a test module, the assembly comprising:
  a harness-specific connector which is connectable to the existing harness connector,
  a test box connector module connected to the harness-specific connector, for connecting to a test module, and
  a unique identifier which is readable on the assembly and which is unique to the test box connector module;
  wherein the unique identifier is used to identify the test box connector module and to determine, from a list of unique mate-in interface identifications and associated connector configurations, which corresponding associated connector configurations corresponds to the identifier of the assembly, and within the corresponding associated connector configurations corresponding to the unique mate-in interface identification of a mate-in interface, to determine correspondence between contacts of the test module to contacts of the existing harness connector.

2. The assembly of claim 1, wherein the assembly comprises a memory comprising the identifier which is readable in the memory.

3. The assembly of claim 1, wherein the assembly comprises a label comprising the identifier which is readable on the label.

4. The assembly of claim 1, wherein the assembly comprises the identifier etched onto the mate-in interface to be readable thereon.

5. The assembly of claim 1, wherein the harness-specific connector is a separate and distinct entity from the test box connector module.

6. The assembly of claim 1, further comprising a computing device for performing the step of using the identifier which is readable to identify the test box connector module and to determine, from a list of unique mate-in interface IDs and associated connector configurations, which one of the associated connector configurations corresponds to the identifier of the assembly.

7. The assembly of claim 6, wherein the computing device is further for performing the step of determining the correspondence between the contacts of the test module to the contacts of the existing harness connector and to instruct a continuity test signal through the contacts of the existing harness connector.

8. A method for interfacing an existing harness connector of an installed wiring harness to a test module with an assembly, the method comprising:
  providing a harness-specific connector which is connectable to the existing harness connector,
  providing a test box connector module connected to the harness-specific connector, for connecting to a test module,
  providing a unique identifier which is readable on the assembly and which is unique to the test box connector module;
  using the unique identifier to identify the test box connector module;
  using the unique identifier to determine, from a list of unique mate-in interface identifications and associated connector configurations, which corresponding associated connector configuration corresponds to the identifier of the assembly, and
  within the corresponding associated connector configurations corresponding to the unique mate-in interface identification of a mate-in interface, determining correspondence between contacts of the test module to contacts of the existing harness connector.

9. The method of claim 8, wherein the mate-in interface comprises a memory comprising the identifier which is readable in the memory.

10. The method of claim 8, wherein the mate-in interface comprises a label comprising the identifier which is readable on the label.

11. The method of claim 8, wherein the mate-in interface comprises the identifier etched onto the mate-in interface to be readable thereon.

12. The method of claim 8, wherein the harness-specific connector is a separate and distinct entity from the test box connector module.

13. The method of claim 8, further comprising a computing device for performing the steps of using the unique identifier to identify the test box connector module and to determine which one of the associated connector configurations corresponds to the identifier of the assembly.

14. A system for testing equipment using a test box unit for testing the equipment, the system comprising:
  a mate-in interface for connection to the test box unit; and for connection to contacts on the equipment, the mate-in interface having a unique mate-in interface identifier being readable thereon; and
  a computing device adapted to:
    retrieve, from a list of identifiers and associated connector configurations, which corresponding associated connector configurations corresponds to the unique mate-in interface identifier of the mate-in interface;
    within the corresponding associated connector configurations corresponding to the unique mate-in interface identifier of the mate-in interface, select any one of the contacts for testing; and
    trigger a first signal to be inputted through the any one of the contacts to ground and measure the first signal; and
    trigger a second signal to be inputted through the any one of the contacts to any other one of the contacts and measure the second signal.

15. The system of claim 14, wherein the mate-in interface comprises a memory comprising the identifier which is readable in the memory.

16. The system of claim 14, wherein the mate-in interface comprises a label comprising the identifier which is readable on the label.

17. The system of claim 14, wherein the mate-in interface comprises the identifier etched onto the mate-in interface to be readable thereon.

18. The system of claim 14, wherein the mate-in interface comprises:
  a generic mate-in interface for connection to the test box unit, the generic mate-in interface having the identifier readable thereon; and a specific mate-in interface for connection to the generic mate-in interface, the specific mate-in interface for connection to the equipment.

19. The system of claim 14, wherein the mate-in interface comprises:
    a generic mate-in interface for connection to the test box unit; and
    a specific mate-in interface for connection to the generic mate-in interface, the specific mate-in interface for connection to the equipment, the specific mate-in interface having the identifier readable thereon.

* * * * *